(12) United States Patent
Yip

(10) Patent No.: US 11,094,379 B1
(45) Date of Patent: Aug. 17, 2021

(54) MEMORY CELL PROGRAMMING

(71) Applicant: MICRON TECHNOLOGY, INC., Boise, ID (US)

(72) Inventor: Aaron S. Yip, Los Gatos, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/835,664

(22) Filed: Mar. 31, 2020

(51) Int. Cl.
*G11C 11/56* (2006.01)
*G11C 16/12* (2006.01)
*G11C 16/34* (2006.01)
*G11C 16/10* (2006.01)

(52) U.S. Cl.
CPC ............ *G11C 16/12* (2013.01); *G11C 16/107* (2013.01); *G11C 16/3459* (2013.01)

(58) Field of Classification Search
CPC .... G11C 16/12; G11C 16/107; G11C 16/3459
USPC .................................................. 365/185.18
See application file for complete search history.

(56) References Cited

U.S. PATENT DOCUMENTS

| | | | |
|---|---|---|---|
| 6,538,923 B1 | 5/2003 | Parker | |
| 8,953,386 B2 | 2/2015 | Dutta | |
| 9,767,894 B2 * | 9/2017 | Tang | ............... G11C 11/5628 |
| 9,767,909 B1 | 9/2017 | Yip | |
| 2007/0285972 A1 | 12/2007 | Horii et al. | |
| 2008/0037327 A1 | 2/2008 | Park et al. | |
| 2010/0195397 A1 | 8/2010 | Hemink | |
| 2010/0202211 A1 | 8/2010 | Park et al. | |
| 2014/0169068 A1 | 6/2014 | Lee et al. | |
| 2015/0043275 A1 | 2/2015 | Srinivasan et al. | |
| 2015/0357031 A1 * | 12/2015 | Tang | ............... G06F 3/0659 711/103 |
| 2016/0005491 A1 | 1/2016 | Yuan et al. | |
| 2016/0217868 A1 | 7/2016 | Dutta et al. | |
| 2017/0255399 A1 | 9/2017 | Yang et al. | |
| 2017/0330627 A1 * | 11/2017 | Yip | ............... G11C 16/10 |
| 2018/0301203 A1 * | 10/2018 | Kim | ............... G11C 29/028 |

* cited by examiner

*Primary Examiner* — Xiaochun L Chen
(74) *Attorney, Agent, or Firm* — Dicke, Billig & Czaja, PLLC

(57) ABSTRACT

Methods, as well as apparatus configured to perform similar methods, might include programming a plurality of memory cells to a particular data state of a plurality of data states, and, for each memory cell of the plurality of memory cells whose target data state is higher than the particular data state, determining a respective indication of a programming voltage level deemed sufficient to program that memory cell to a respective target threshold voltage corresponding to its respective target data state, and further programming that memory cell using a programming voltage level of a plurality of programming voltage levels corresponding to the respective indication of the programming voltage level deemed sufficient to program that memory cell to the respective target threshold voltage corresponding to its respective target data state.

27 Claims, 13 Drawing Sheets

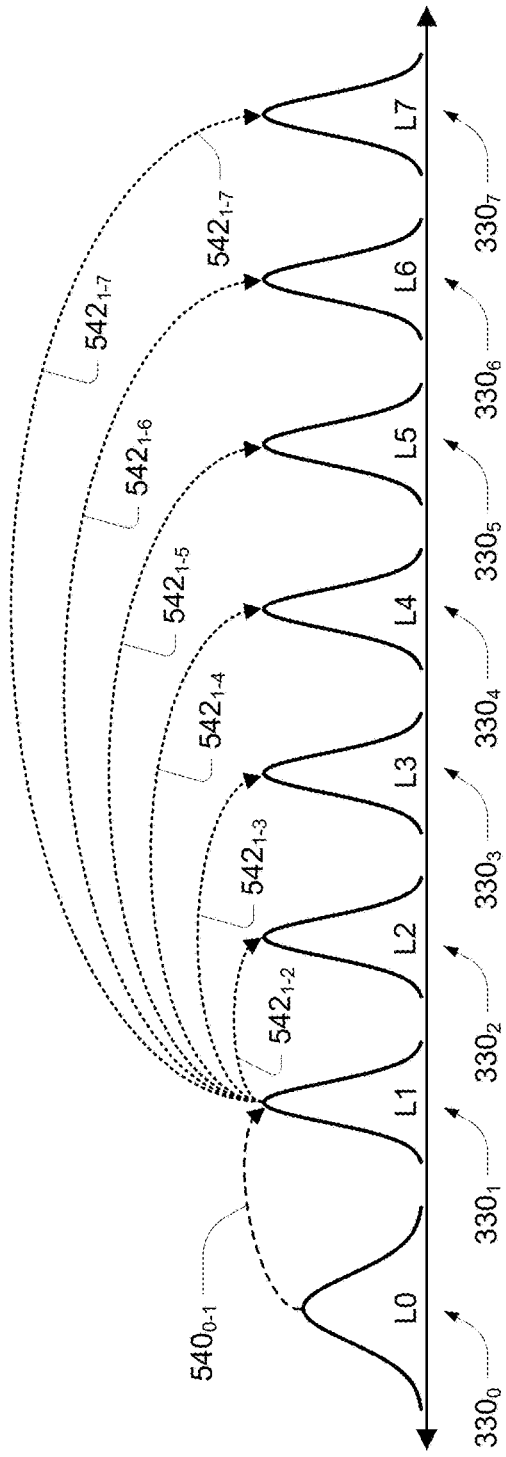
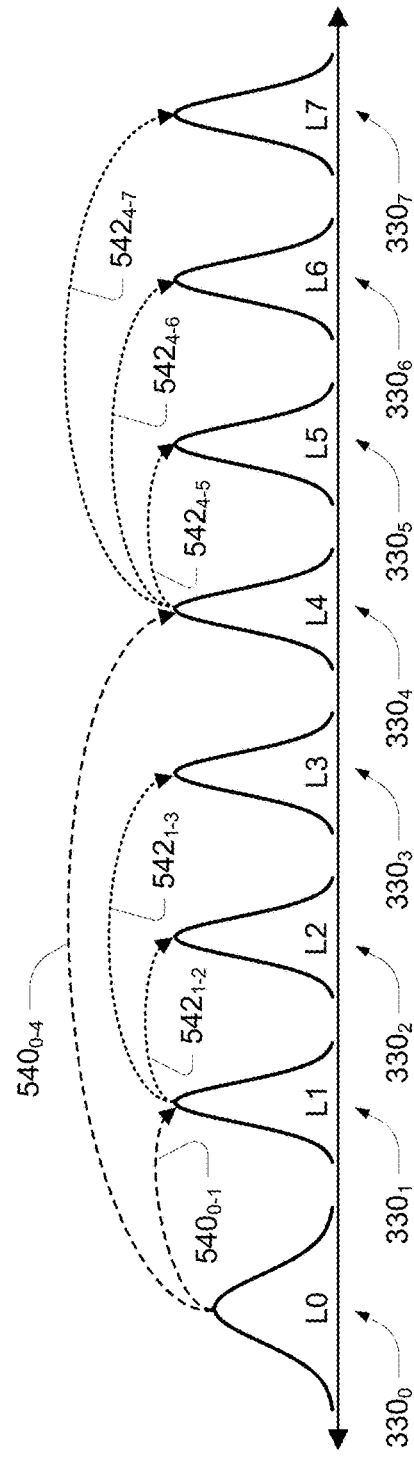
FIG. 5A
FIG. 5B

811 — Apply a Plurality of Programming Pulses to a Selected Access Line Connected to Each Memory Cell of a Plurality of Memory Cells During Programming of the Plurality of Memory Cells to a Particular Data State of a Plurality of Data States, Wherein Each Programming Pulse of the Plurality of Programming Pulses has a Respective Voltage Level of a First Plurality of Voltage Levels, and Wherein Each Memory Cell of the Plurality of Memory Cells has a Respective Target Data State of the Plurality of Data States that is Equal To or Higher Than the Particular Data State 813 — For Each Memory Cell of the Plurality of Memory Cells Whose Respective Target Data State is Higher Than the Particular Data State, Determine a Respective Voltage Level of the First Plurality of Voltage Levels Deemed to Cause That Memory Cell to Reach the Particular Data State 815 — For Each Memory Cell of the Plurality of Memory Cells Whose Respective Target Data State is Higher Than the Particular Data State, Determine a Respective Value Indicative of a VgVt of That Memory Cell At a Representative Threshold Voltage Level for the Particular Data State 817 — For Each Memory Cell of the Plurality of Memory Cells Whose Respective Target Data State is Higher Than the Particular Data State, Determine a Respective Voltage Level of a Second Plurality of Voltage Levels Deemed Sufficient to Program That Memory Cell to a Respective Threshold Voltage Corresponding to Its Respective Target Data State 819 — Apply a Subsequent Programming Pulse to the Selected Access Line and, For Each Memory Cell of the Plurality of Memory Cells Whose Respective Target Data State is Higher Than the Particular Data State, Enable That Memory Cell for Programming When a Voltage Level of the Subsequent Programming Pulse Corresponds to the Respective Voltage Level of the Second Plurality of Voltage Levels for That Memory Cell

FIG. 8

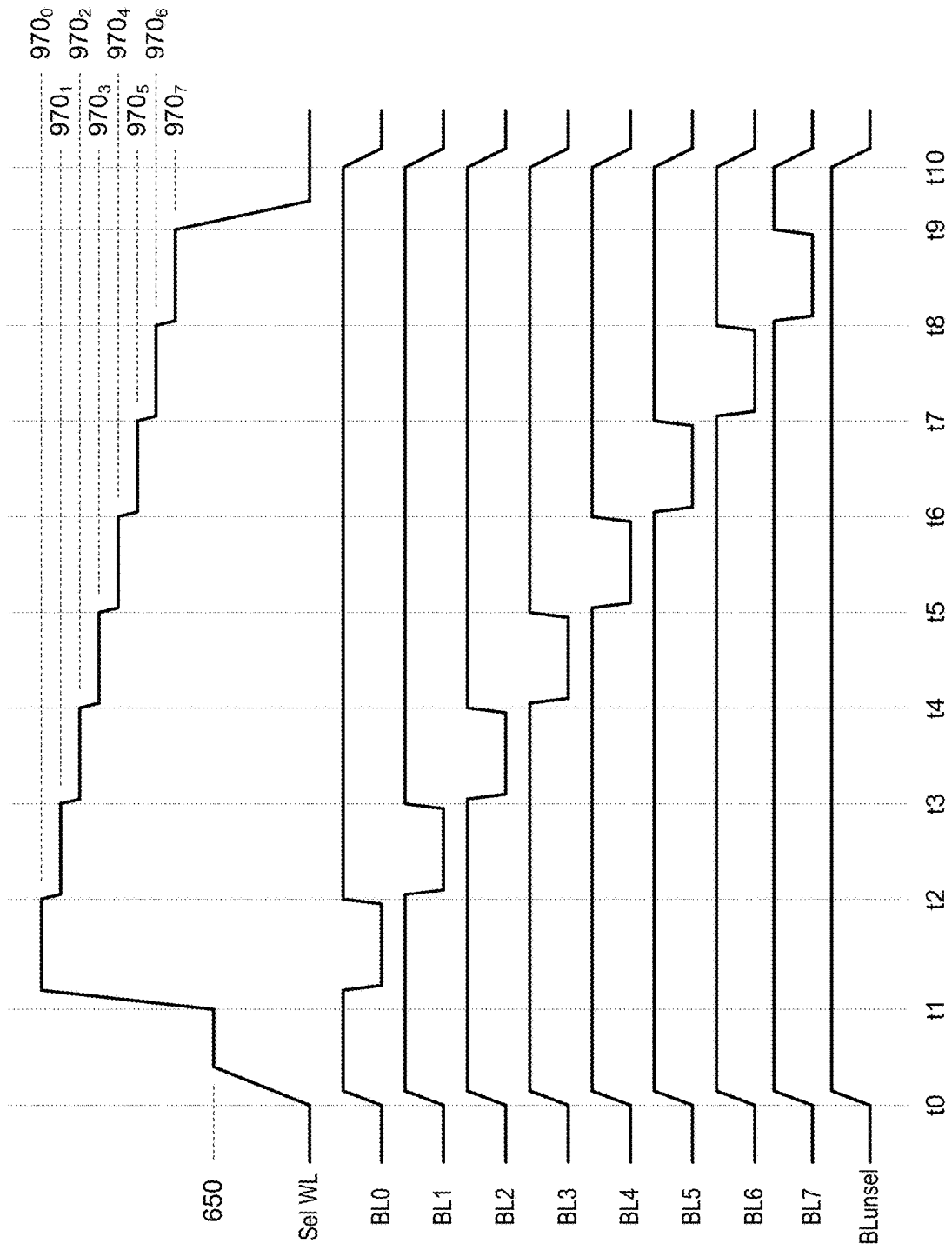

MEMORY CELL PROGRAMMING

TECHNICAL FIELD

The present disclosure relates generally to integrated circuits, and, in particular, in one or more embodiments, the present disclosure relates to apparatus and methods for programming of memory cells.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor might be connected to a source, while each drain select transistor might be connected to a data line, such as column bit line. Variations using more than one select gate between a string of memory cells and the source, and/or between the string of memory cells and the data line, are known.

Programming in memories is typically accomplished by applying a plurality of programming pulses, separated by verify pulses, to program each memory cell of a selected group of memory cells to a respective target data state (which might be an interim or final data state). With such a scheme, the programming pulses are applied to access lines, such as those typically referred to as word lines, for selected memory cells. After each programming pulse, one or more verify voltage levels are typically used to verify the programming of the selected memory cells. Current programming typically uses many programming pulses in an incremental step pulse programming (ISPP) scheme, where each programming pulse is a single-level pulse that moves the memory cell threshold voltage by some amount. Before each programming pulse, word lines might be precharged, and after each programming pulse, the word lines might be discharged. This can lead to high power consumption.

BRIEF DESCRIPTION OF THE DRAWINGS

FIGS. 5A-5C conceptually depict performance of the method of FIG. 4 in accordance with various embodiments.

FIG. 8 depicts a flowchart of a method of operating a memory according to an embodiment.

FIG. 9 conceptually depicts waveforms of voltage levels for various nodes for applying a multi-level programming pulse in accordance with an embodiment.

DETAILED DESCRIPTION

Figure 1A:
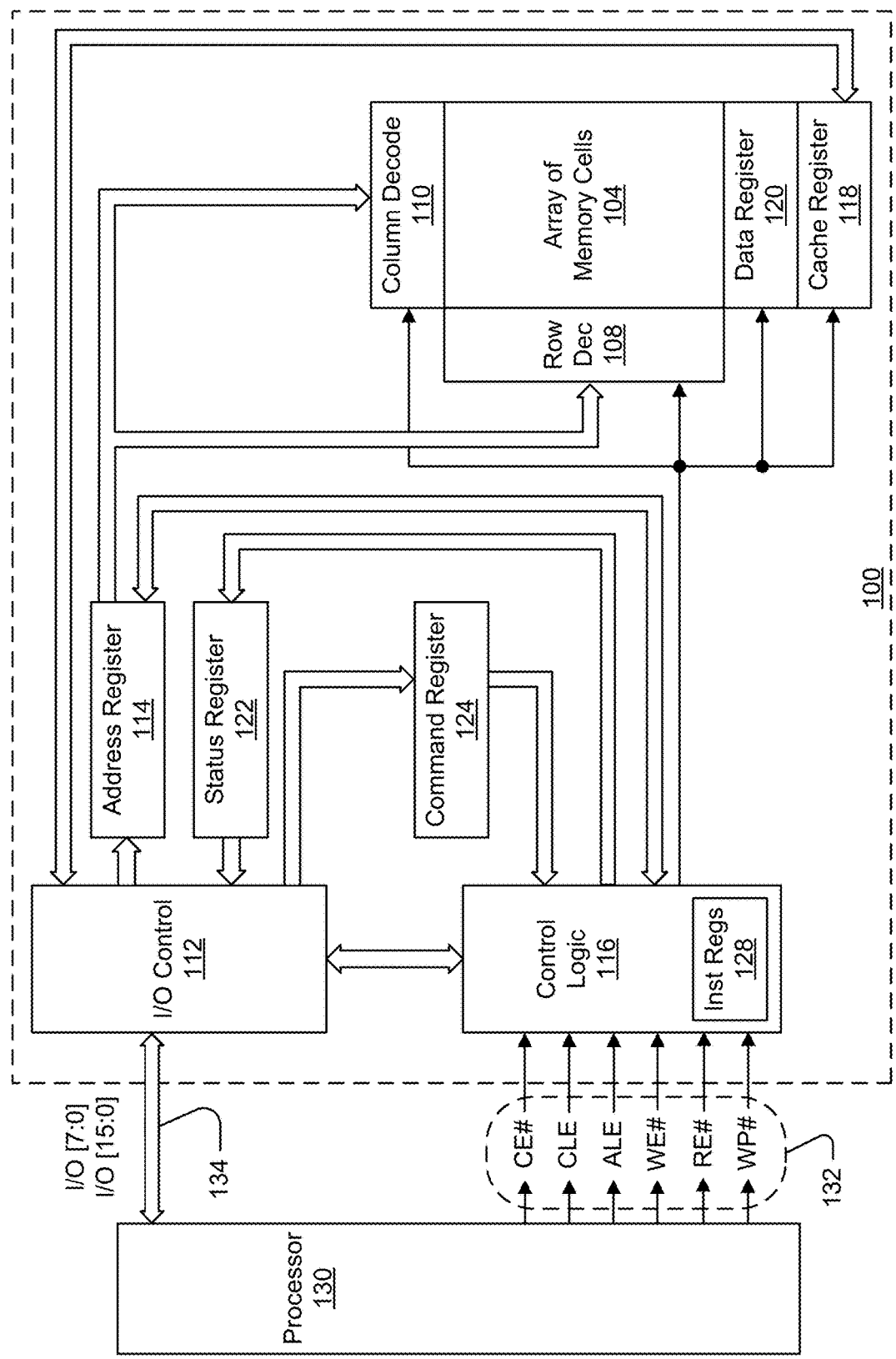
FIG. 1A is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1A is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1A) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1A) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1A has been simplified. It should be recognized that the functionality of the various block components described with reference to FIG. 1A might not necessarily be segregated to distinct components or component portions of an integrated circuit device. For example, a single component or component portion of an integrated circuit device could be adapted to perform the functionality of more than one block component of FIG. 1A. Alternatively, one or more components or component portions of an integrated circuit device could be combined to perform the functionality of a single block component of FIG. 1A.

Additionally, while specific I/O pins are described in accordance with popular conventions for receipt and output of the various signals, it is noted that other combinations or numbers of I/O pins (or other I/O node structures) might be used in the various embodiments.

Figure 1B:
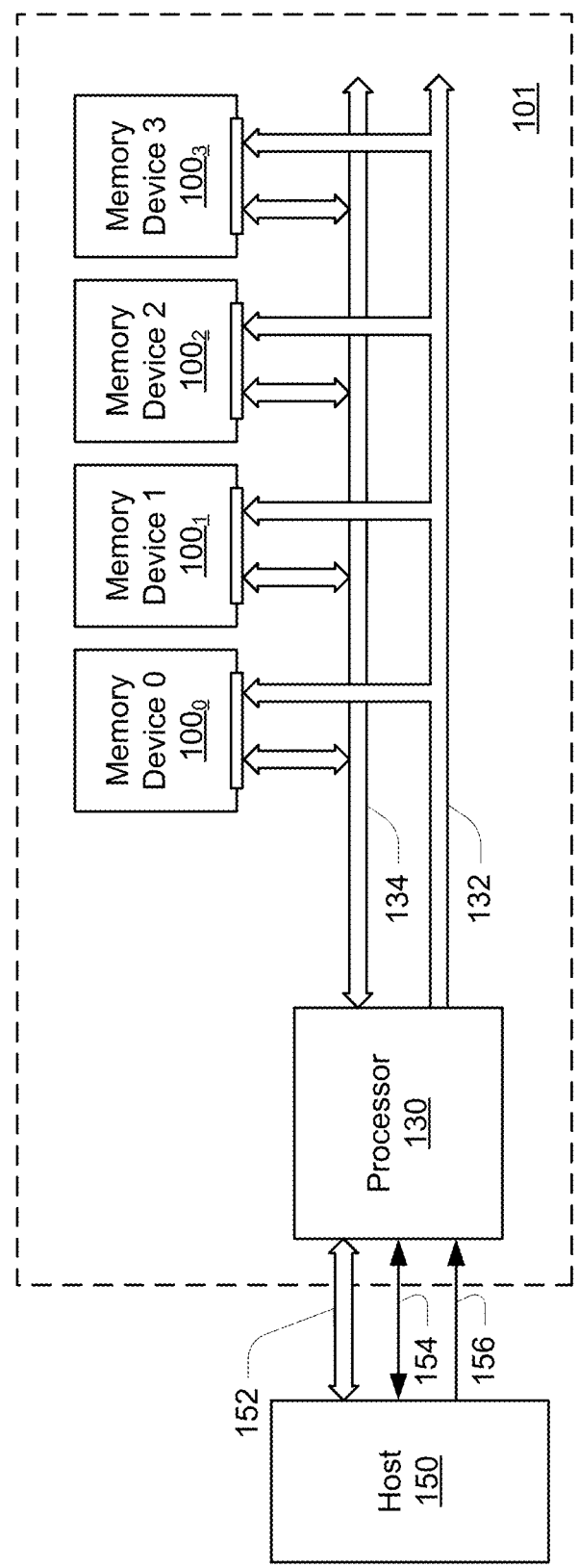
FIG. 1B is a simplified block diagram of an apparatus in the form of a memory module in communication with a host as part of an electronic system, according to another embodiment.

A given processor 130 might be in communication with one or more memory devices 100, e.g., dies. FIG. 1B is a simplified block diagram of an apparatus in the form of a memory module 101 in communication with a host 150 as part of an electronic system, according to another embodiment. Memory devices 100, processor 130, control link 132, and I/O bus 134 may be as described with reference to FIG. 1A. Although memory module (e.g., package) 101 of FIG. 1B is depicted with four memory devices 100 (e.g., dies), memory module 101 could have some other number of one or more memory devices 100.

Because processor 130 (e.g., a memory controller) is between the host 150 and the memory devices 100, communication between the host 150 and the processor 130 may involve different communication links than those used between the processor 130 and the memory devices 100. For example, the memory module 101 might be an Embedded MultiMediaCard (eMMC) of a solid state drive (SSD). In accordance with existing standards, communication with an eMMC might include a data link 152 for transfer of data (e.g., an 8-bit link), a command link 154 for transfer of commands and device initialization, and a clock link 156 providing a clock signal for synchronizing the transfers on the data link 152 and command link 154. The processor 130 might handle many activities autonomously, such as power-loss detection, error correction, management of defective blocks, wear leveling and address translation.

Figure 2A:
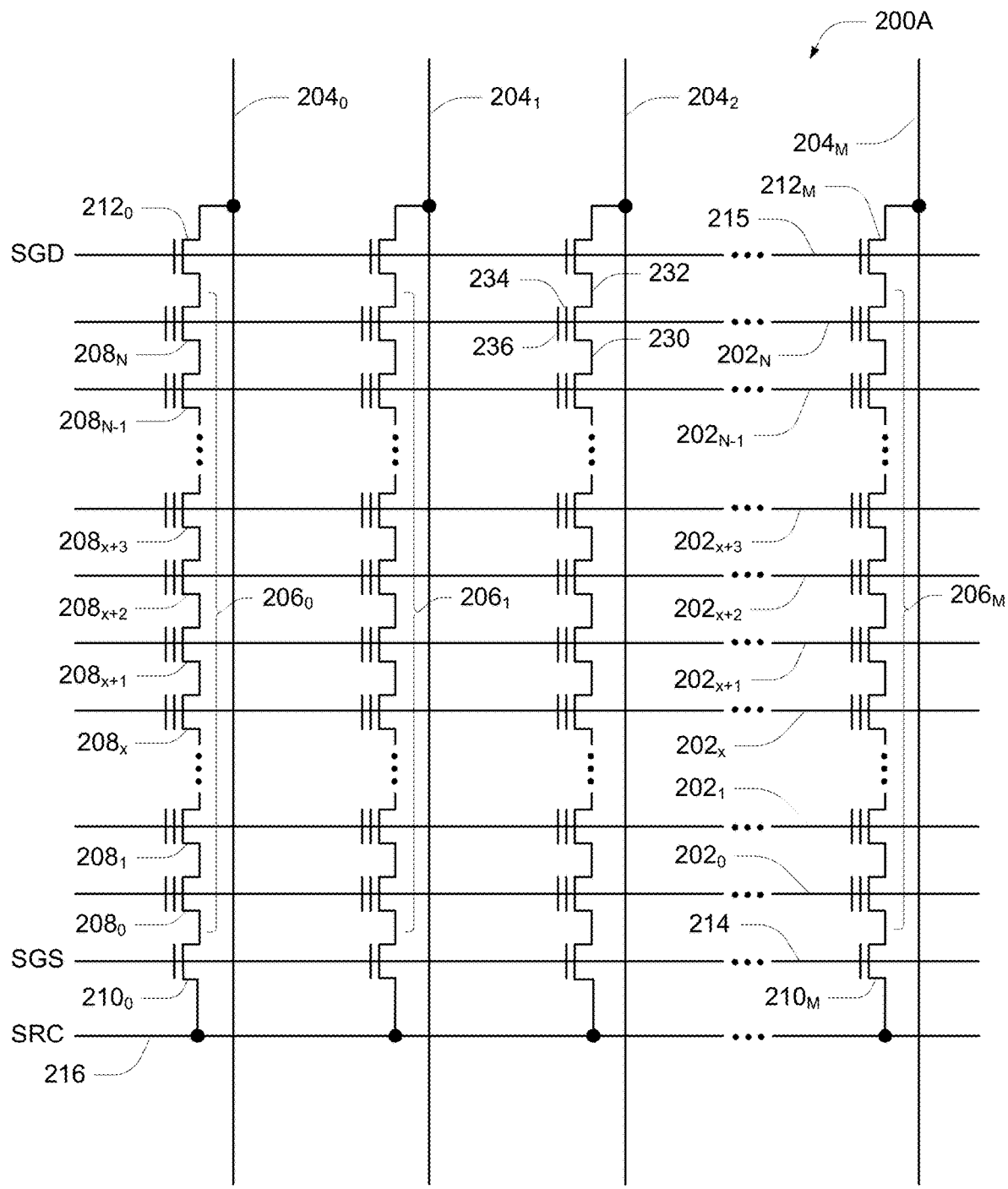
FIGS. 2A-2B are schematics of portions of an array of memory cells as could be used in a memory of the type described with reference to FIG. 1A.

FIG. 2A is a schematic of a portion of an array of memory cells 200A, such as a NAND memory array, as could be used in a memory of the type described with reference to FIG. 1A, e.g., as a portion of array of memory cells 104. Memory array 200A includes access lines, such as word lines $202_0$ to $202_N$, and data lines, such as bit lines $204_0$ to $204_M$. The word lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a quasi-two-dimensional memory array and might have a generally planar structure, e.g., where the common source 216, NAND strings 206 and bit lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the bit lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) a word line 202.

A column of the memory cells 208 might be a NAND string 206 or a plurality of NAND strings 206 selectively connected to a given bit line 204. A row of the memory cells 208 might be memory cells 208 commonly connected to a given word line 202. A row of memory cells 208 can, but need not, include all memory cells 208 commonly connected to a given word line 202. Rows of memory cells 208 might often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) might be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) might be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A might be numbered consecutively from bit line $204_0$ to bit line $204_M$. Other groupings of memory cells 208 commonly connected to a given word line 202 might also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
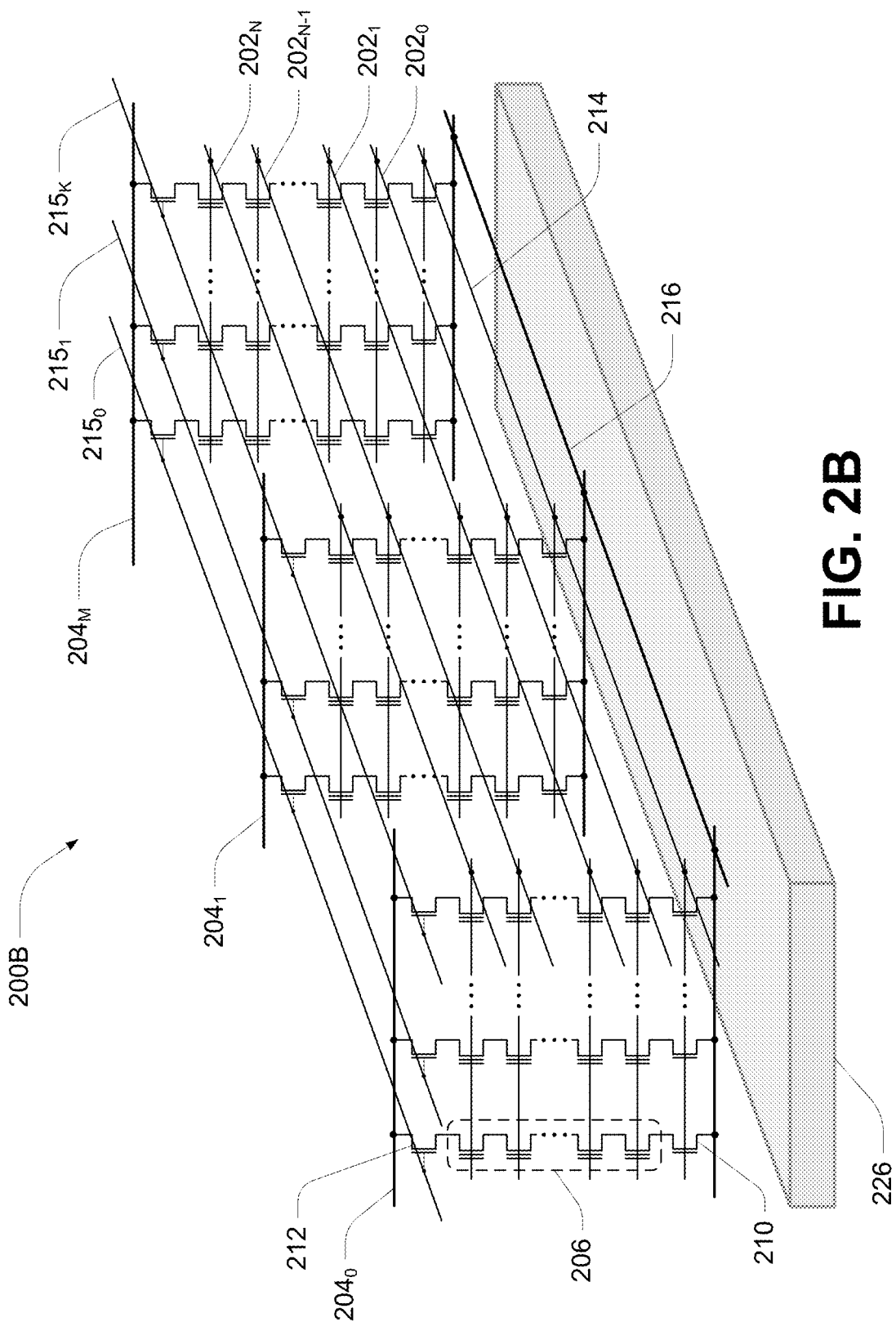

FIG. 2B is another schematic of a portion of an array of memory cells 200B as could be used in a memory of the type described with reference to FIG. 1A, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a bit line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same bit line 204.

Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 might be connected to multiple rows of memory cells of the memory array 200B. Rows of memory cells that are commonly connected to each other by a particular word line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Memory cells might be configured to operate as what are known in the art as single-level memory cells (SLC) or multi-level memory cells (MLC). SLC and MLC memory cells assign a data state (e.g., representing a respective value of one or more digits of information) to a specific range of threshold voltages (Vt) stored on the memory cells. Single level memory cells (SLC) permit the storage of a single binary digit (e.g., bit) of data on each memory cell. Meanwhile, MLC technology permits the storage of more than one binary digit per memory cell (e.g., two bits, three bits, four bits, etc.), depending on the quantity of threshold voltage ranges assigned to the memory cell and the stability of the assigned threshold voltage ranges during the lifetime operation of the memory cell. By way of example, one bit (e.g., 1 or 0) might be represented by two threshold voltage ranges, two bits by four ranges, three bits by eight ranges, etc. Non-binary numbers of threshold voltage ranges are also known, e.g., using two memory cells each configured to operate with three data states to collectively store three bits of information, or 1.5 bits per memory cell.

Programming typically involves applying one or more programming pulses to a selected word line and thus to the control gates of the row of memory cells connected to the selected word line (e.g., having their control gates connected to the selected word line). Typical programming pulses might start at or near 13V and tend to increase in magnitude for each subsequent programming pulse application. While the program potential (e.g., voltage level of the programming pulse) is applied to the selected word line, an enable voltage, such as a ground potential (e.g., 0V), might be applied to the channels of memory cells selected for programming, i.e., those memory cells for which the programming operation is intended to shift their data state to some higher level. This might result in a charge transfer from the channel to the charge storage structures of these selected memory cells. For example, floating gates are typically charged through direct injection or Fowler-Nordheim tunneling of electrons from the channel to the floating gate, resulting in a threshold voltage typically greater than zero in a programmed state.

An inhibit voltage (e.g., Vcc) is typically applied to bit lines which are selectively connected to a NAND string containing a memory cell that is connected to the selected word line and is not selected for, or no longer selected for, programming. In addition to bit lines selectively connected to memory cells already at their target data state, these unselected bit lines might further include bit lines that are not addressed by the programming operation. For example, a logical page of data might correspond to memory cells connected to a particular word line and selectively connected to some particular subset of the bit lines (e.g., every other bit line), such that the remaining subset of bit lines would be unselected for the programming operation and thus inhibited.

Between the application of one or more programming pulses, a verify operation is typically performed to check each selected memory cell to determine if it has reached its target data state. If a selected memory cell has reached its target data state, it might be inhibited from further programming if there remain other selected memory cells still requiring additional programming pulses to reach their target data states. Following a verify operation, an additional programming pulse might be applied if there are memory cells that have not completed programming. This process of applying a programming pulse followed by performing a verify operation (e.g., a program-verify phase of a programming operation) typically continues until all the selected memory cells have reached their target data states. If a particular number of programming pulses (e.g., maximum number) have been applied, or a particular voltage level of a programming pulse (e.g., maximum voltage level) has been reached, and one or more selected memory cells still have not completed programming, those memory cells might be marked as defective, for example. Various embodiments seek to reduce a number of these program-verify phases of a programming operation.

Figure 3:
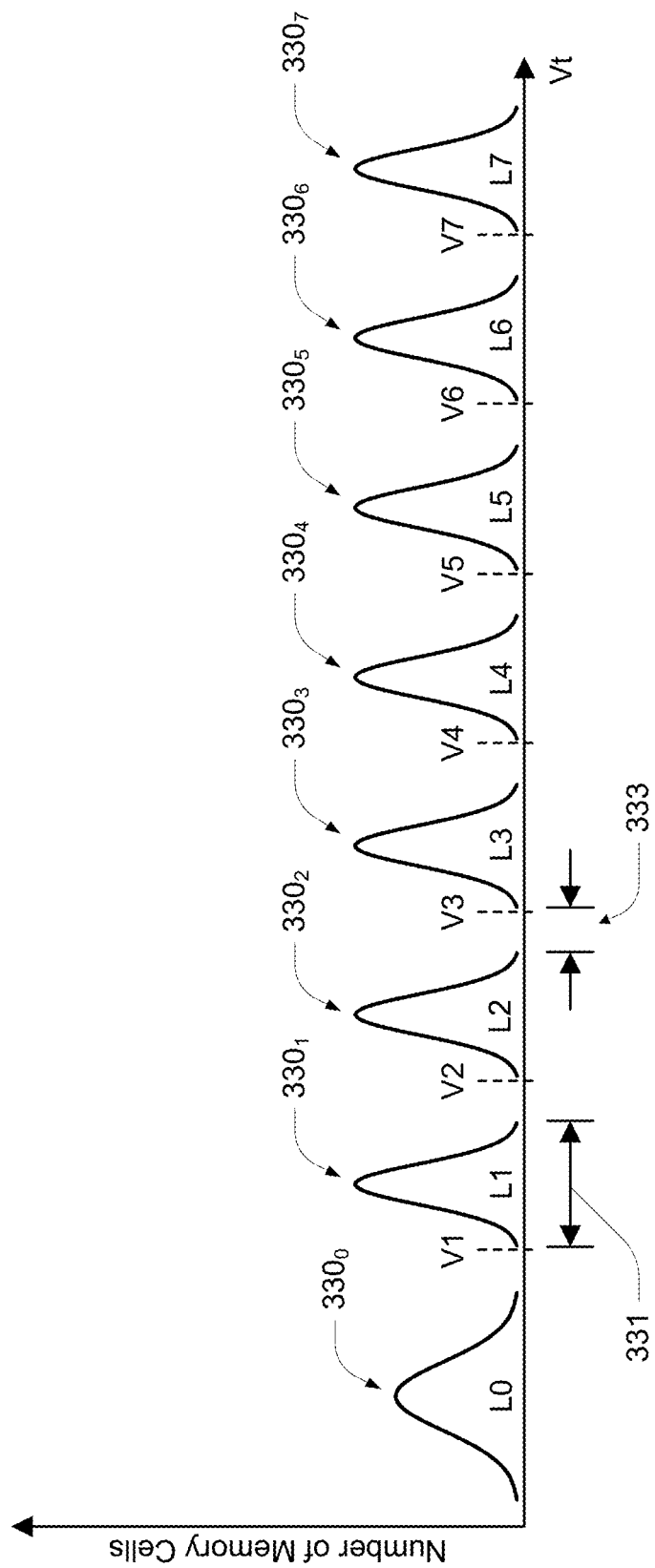
FIG. 3 is a conceptual depiction of threshold voltage ranges of a plurality of memory cells as could be used with embodiments.

FIG. 3 is a conceptual depiction of threshold voltage ranges of a plurality of memory cells as could be used with embodiments. FIG. 3 illustrates an example of threshold voltage ranges and their distributions for a population of eight-level (e.g., three-bit) memory cells, often referred to as TLC memory cells. For example, such a memory cell might be programmed to a threshold voltage (Vt) that falls within one of eight different threshold voltage ranges $330_0$-$330_7$, each being used to represent a data state corresponding to a bit pattern of three bits. The threshold voltage range $330_0$ typically has a greater width than the remaining threshold voltage ranges $330_1$-$330_7$ as memory cells are generally all placed in the data state corresponding to the threshold voltage range $330_0$, then subsets of those memory cells are subsequently programmed to have threshold voltages in one of the threshold voltage ranges $330_1$-$330_7$. As programming operations are generally more incrementally controlled than erase operations, these threshold voltage ranges $330_1$-$330_7$ might tend to have tighter distributions.

The threshold voltage ranges $330_0$, $330_1$, $330_2$, $330_3$, $330_4$, $330_5$, $330_6$ and $330_7$ might each represent a respective data state, e.g., L0, L1, L2, L3, L4, L5, L6 and L7, respectively. The threshold voltage ranges $330_1$-$330_7$ might each have a width 331, e.g., a voltage difference between a highest voltage level and a lowest voltage level of the corresponding threshold voltage range 330. In addition, a dead space 333 (e.g., sometimes referred to as a margin) is typically maintained between adjacent threshold voltage ranges $330_1$-$330_7$ during programming in order to mitigate subsequent overlapping of the threshold voltage ranges over time. The width 331 of any one threshold voltage range $330_1$-$330_7$ might be the same or different than the width 331 of any other threshold voltage range $330_1$-$330_7$. Similarly, the dead space 333 between any pair of adjacent threshold voltage ranges 330 might be the same or different than the dead space 333 between any remaining pair of adjacent threshold voltage ranges 330.

As depicted in FIG. 3, if the threshold voltage of a memory cell is within the first of the eight threshold voltage ranges $330_0$, the memory cell in this case might be storing a data state L0 having a data value of logical 111 and is typically referred to as the erased state of the memory cell. If the threshold voltage is within the second of the eight threshold voltage ranges $330_1$, the memory cell in this case might be storing a data state L1 having a data value of logical 011. If the threshold voltage is within the third of the eight threshold voltage ranges $330_2$, the memory cell in this case might be storing a data state L2 having a data value of logical 001, and so on. Table 1 provides one possible correspondence between the data states and their corresponding logical data values. Other assignments of data states to logical data values are known. Memory cells remaining in the lowest data state (e.g., the erased state or L0 data state), as used herein, will be deemed to be programmed to the lowest data state.

TABLE 1

| Data State | Logical Data Value |
|---|---|
| L0 | 111 |
| L1 | 011 |
| L2 | 001 |
| L3 | 101 |
| L4 | 100 |
| L5 | 000 |
| L6 | 010 |
| L7 | 110 |

Program-verify voltage levels, or simply verify voltage levels, V1-V7 might be used to determine when a memory cell being programmed has reached a particular threshold voltage range $330_1$-$330_7$, respectively. For example, a memory cell being programmed to the data state L1 might be enabled for programming for one or more programming pulses (e.g., one or more programming pulses of increasing voltage levels) of a programming operation until it can no longer be activated in response to a gate-source voltage equal to the verify voltage level V1, a memory cell being programmed to the data state L2 might be enabled for programming for one or more programming pulses of the programming operation until it can no longer be activated in response to a gate-source voltage equal to the verify voltage level V2, a memory cell being programmed to the data state L3 might be enabled for programming for one or more programming pulses of the programming operation until it can no longer be activated in response to a gate-source voltage equal to the verify voltage level V3, and so on.

Various embodiments might utilize a determination of a relationship between an applied voltage level (e.g., a gate-source voltage Vg) across a memory cell to its resulting threshold voltage as an indication of a programming voltage level sufficient to program a memory cell, or group of memory cells, to a particular target threshold voltage, or range of threshold voltages. This relationship might be referred to as VgVt and represents a difference between the applied voltage level across a memory cell and its resulting threshold voltage, e.g., VgVt=Vg−Vt. For example, if a voltage level of 13V is applied to a control gate of a memory cell whose body (e.g., channel) is at a ground potential (e.g., 0V), and the resulting threshold voltage is −0.5V, the VgVt for that memory cell might be (13V−0V)−(−0.5V)=13.5V.

It is expected that the VgVt relationship as a function of target threshold voltage might be deemed to be linear within normal operation of a memory cell, and might have a positive slope, such that the VgVt at a threshold voltage of 0.5V for the same memory cell might be expected to be greater than 13.5V. The VgVt relationship to threshold voltage might be more accurately described by a polynomial equation. Regardless, the VgVt relationship for a particular memory as a function of threshold voltage (e.g., the slope of a line, the constants of a polynomial or other characterization) might be determined empirically, based on knowledge of the structure and materials of the memory cells, or directly through experimentation. For example, programming pulses of various voltage levels could be applied to one or more memory cells, and the resulting threshold voltages could be determined after each of these programming pulses. A composite function could be fitted from the individual responses of these memory cells. A function could be determined for a memory array as a whole, or individual functions might be determined for some sub-portion of the memory array, e.g., by block of memory cells.

Once a VgVt value for a particular threshold voltage is determined (or assigned) for a particular memory cell, the VgVt value for a different threshold voltage can be calculated (e.g., corrected) by fitting the function to the known value. To continue the foregoing example, if the relationship is deemed to be linear with a slope (e.g., $\Delta VgVt/\Delta Vt$) of 0.2, and the VgVt at a threshold voltage of −0.5V is 13.5V, the VgVt at a threshold voltage of 0.5V might be expected to be 13.5V+0.2*(0.5V−(−0.5V))=13.7V. Accordingly, a programming voltage level (e.g., the programming voltage level across the memory cell) of 14.2V might be expected to result in a threshold voltage of 0.5V for that memory cell, e.g., 13.7V+0.5V. Where a non-linear function is utilized, the function could define the change in VgVt value from the measured threshold voltage of a memory cell to the target threshold voltage of that memory cell, and this $\Delta VgVt$ could be added to the determined VgVt of that memory cell at its measured threshold voltage in order to calculate the VgVt value of that memory cell at its target threshold voltage.

Figure 4:
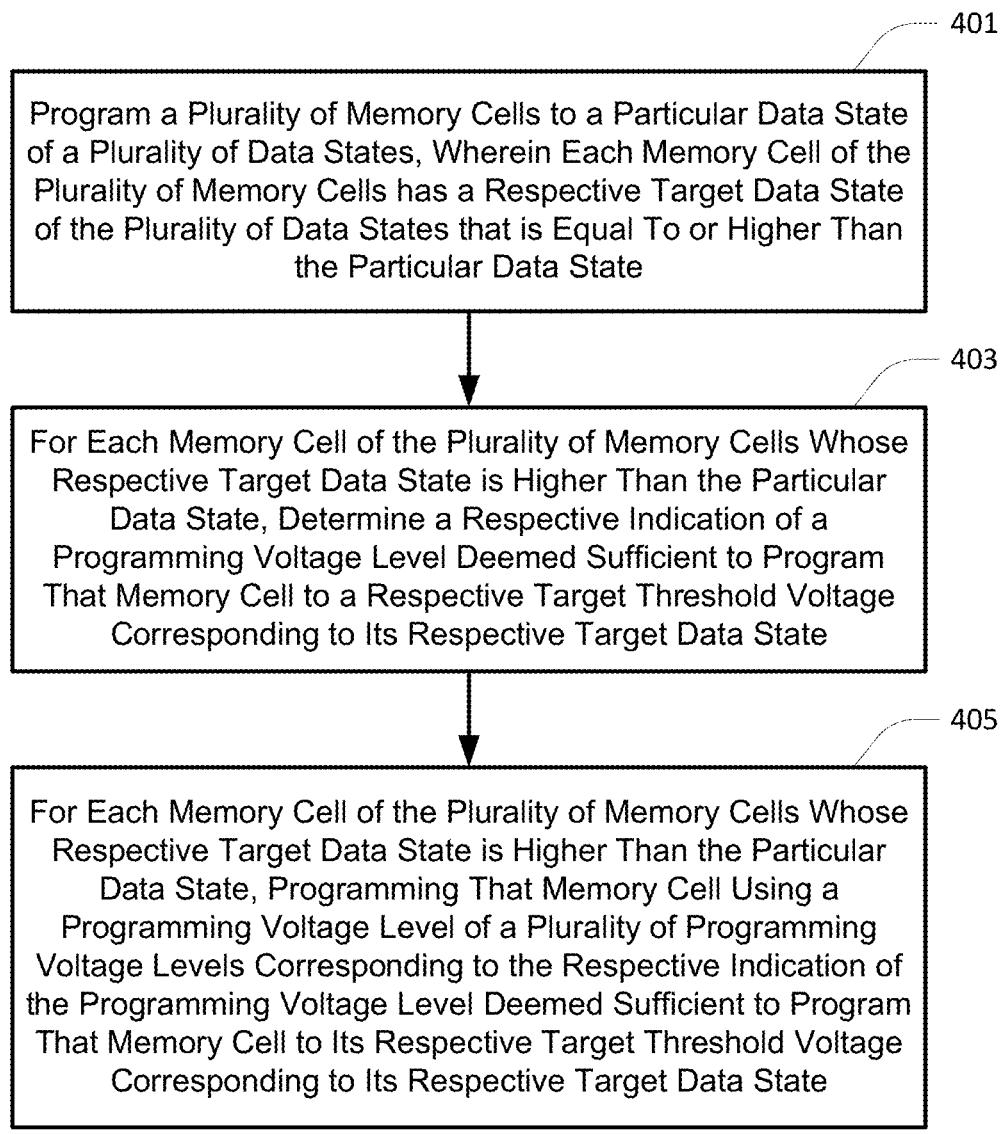
FIG. 4 depicts a flowchart of a method of operating a memory according to an embodiment.

FIG. 4 depicts a flowchart of a method of operating a memory according to an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 401, a plurality of memory cells might be programmed to a particular data state of a plurality of data states for a programming operation. Each memory cell of the plurality of memory cells might have a respective target data state of the plurality of data states that is equal to or higher than the particular data state. For example, with reference to FIG. 3, the plurality of data states might correspond to the data states L0-L7, and the particular data state might correspond to the data state L1. In this example, the plurality of memory cells might correspond to all memory cells connected to an access line selected for the programming operation, and having target data states equal to or higher than the particular data state, e.g., having target data states within the data states L1-L7. Other definitions of the plurality of memory cells, and of the particular data state, are permissible.

At 403, for each memory cell of the plurality of memory cells whose respective target data state is higher than the particular data state, a respective indication of a programming voltage level deemed sufficient to program that memory cell to a respective target threshold voltage corresponding to its respective target data state might be determined. Determination of an indication of a programming voltage level deemed sufficient to program a memory cell to a respective target threshold voltage corresponding to its respective target data state will be described in more detail with reference to FIGS. 6A-6B and 7A-7B.

The respective target threshold voltage corresponding to a particular target data state might correspond to a threshold voltage of a target threshold voltage range for that data state. Alternatively, the respective target threshold voltage corresponding to a particular target data state might correspond to a threshold voltage of an interim threshold voltage range for that target data state. For example, causing large shifts in threshold voltage, e.g., programming a memory cell from the data state L1 to the data state L7, might lead to more variability than causing smaller shifts in threshold voltage, e.g., programming a memory cell from the data state L1 to the data state L2. To mitigate overshooting the target threshold voltage range for a particular data state, a memory cell might first be programmed to some lower, interim, target threshold voltage, e.g., using an interim verify voltage level that is lower than a final verify voltage level. The memory cell might subsequently be programmed to its target threshold voltage, e.g., using its final verify voltage level.

At 405, for each memory cell of the plurality of memory cells whose respective target data state is higher than the particular data state, that memory cell might be programmed using a programming voltage level of a plurality of programming voltage levels corresponding to the respective indication of the programming voltage level deemed sufficient to program that memory cell to its respective target threshold voltage corresponding to its respective target data state. Such programming of memory cells might include applying a multi-level programming pulse to the selected access line, and enabling each memory cell for programming when a voltage level of the multi-level programming pulse corresponds to the respective indication of the programming voltage level deemed sufficient to program that memory cell to its respective target threshold voltage corresponding to its respective target data state. Such programming of memory cells might further include inhibiting each memory cell from programming when the voltage level of the multi-level programming pulse is higher than the respective indication of the programming voltage level deemed sufficient to program that memory cell to its respective target threshold voltage corresponding to its respective target data state. Such programming of memory cells might still further include inhibiting each memory cell from programming when the voltage level of the multi-level programming pulse does not correspond to the respective indication of the programming voltage level deemed sufficient to program that memory cell to its respective target threshold voltage corresponding to its respective target data state.

A programming voltage level of the plurality of programming voltage levels might correspond to a respective indication of a programming voltage level deemed sufficient to program a memory cell to its respective target threshold voltage corresponding to its respective target data state without being equal. For some embodiments, the programming voltage level of the plurality of programming voltage levels corresponding to the respective indication of the programming voltage level deemed sufficient to program a particular memory cell to its respective target threshold voltage corresponding to its respective target data state might be a programming voltage level of the plurality of voltage levels that is nearest the respective indication for that particular memory cell. For further embodiments, the programming voltage level of the plurality of programming voltage levels corresponding to the respective indication of the programming voltage level deemed sufficient to program a particular memory cell to its respective target threshold voltage corresponding to its respective target data state might be a programming voltage level of the plurality of voltage levels that is equal to or higher than the respective indication for that particular memory cell, which might be the lowest programming voltage level of the plurality of voltage levels that is equal to or higher than the respective indication for that particular memory cell.

Programming of the memory cells might include applying a multi-level programming pulse to the selected access line, with each voltage level of the multi-level programming pulse corresponding to a respective programming voltage level of the plurality of programming voltage levels. For some embodiments having an expected channel voltage level of 0V, each voltage level of the multi-level programming pulse might equal a respective programming voltage level of the plurality of programming voltage levels. For some embodiments having an expected channel voltage level other than 0V, each voltage level of the multi-level programming pulse might equal a sum of a respective programming voltage level of the plurality of programming voltage levels plus the expected channel voltage level.

The plurality of memory cells might correspond to all memory cells connected to the selected access line and having a target data state other than a lowest data state, e.g., L0, for a given programming operation. Alternatively, the plurality of memory cells might correspond to a subset (e.g., a proper subset) of the memory cells connected to the selected access line and having a target data state other than the lowest data state for the given programming operation. For embodiments where the plurality of memory cells corresponds to a subset of the memory cells connected to the selected access line and having a target data state other than the lowest data state for the given programming operation, the method of FIG. 4 might be performed concurrently for more than one plurality of memory cells. FIGS. 5A and 5B conceptually depict how the method of FIG. 4 might be performed for embodiments where the plurality of memory cells corresponds to all memory cells connected to the selected access line and having a target data state other than the lowest data state for the given programming operation, e.g., FIG. 5A, and where the plurality of memory cells corresponds to a subset of the memory cells connected to the selected access line and having a target data state other than the lowest data state for the given programming operation, e.g., FIG. 5B.

FIG. 5A conceptually depicts programming memory cells in accordance with the method of FIG. 4 where the plurality of memory cells corresponds to all memory cells connected to the selected access line that are selected for programming and have a target data state other than the data state L0 for the given programming operation, and where the particular data state is the data state L1.

As depicted in FIG. 5A, the plurality of memory cells might be programmed to the data state L1 at 401, as represented by line $540_{0-1}$. Programming the memory cells as described at 405 might subsequently facilitate shifting memory cells having the data state L1 to their respective target data states L2, L3, L4, L5, L6 and L7, as represented by lines $542_{1-2}$, $542_{1-3}$, $542_{1-4}$, $542_{1-5}$, $542_{1-6}$, and $542_{1-7}$, respectively. Note that memory cells whose target data state is the data state L1 might be considered to have completed programming, and might be inhibited from further programming, as they were already at their target data state after 401.

FIG. 5B conceptually depicts programming memory cells in accordance with the method of FIG. 4 where a first plurality of memory cells corresponds to the subset of memory cells connected to the selected access line that are selected for programming and have target data states L1, L2 or L3, with a first particular data state corresponding to the data state L1, and where a second plurality of memory cells corresponds to the subset of memory cells connected to the selected access line that are selected for programming and have target data states L4, L5, L6 or L7, with a second particular data state corresponding to the data state L4.

As depicted in FIG. 5B, the first plurality of memory cells having the data state L0 might be programmed to the data state L1 at 401, as represented by line $540_{0-1}$, and the second plurality of memory cells having the data state L0 might be programmed (e.g., concurrently programmed) to the data state L4 at 401, as represented by line $540_{0-4}$. Programming the memory cells as described at 405 might subsequently shift memory cells having the data state L1 to their respective target data states L2 and L3, as represented by lines $542_{1-2}$ and $542_{1-3}$, respectively, and shift memory cells having the data state L4 to their respective target data states L5, L6 and L7, as represented by lines $542_{4-5}$, $542_{4-6}$, and $542_{4-7}$, respectively. Note that memory cells whose target data state is the data state L1 or the data state L4 might be considered to have completed programming, and might be inhibited from further programming, as they were already at their target data states after 401. As used herein, a first act and a second act occur concurrently when the first act occurs simultaneously with the second act for at least a portion of a duration of the second act. For example, a same programming pulse might be applied to an access line simultaneously connected to a memory cell being programmed to the data state L1 and to a memory cell being programmed to the data state L4. The memory cell being programmed to the data state L1 and the memory cell being programmed to the data state L4 might each be enabled for programming during at least a portion of that programming pulse, but do not need to be simultaneously enabled for programming.

While the foregoing example was specific to TLC memory having eight possible data states for a programming operation, the concepts are applicable to lesser or greater numbers of data states. Consider QLC memory having sixteen possible data states, e.g., data states L0-L15 corresponding to increasing, and mutually exclusive, threshold voltage ranges. For one embodiment, the plurality of memory cells might correspond to all memory cells having target data states within L1-L15, and the particular data state might correspond to the data state L1. For another embodiment, respective pluralities of memory cells might correspond to those memory cells having target data states within L1-L7, and those memory cells having target data states within L8-L15, while respective particular data states for those pluralities of memory cells might correspond to the data states L1 and L8, respectively. For a further embodiment, respective pluralities of memory cells might correspond to those memory cells having target data states within L1-L3, those memory cells having target data states within L4-L7, those memory cells having target data states within L8-L11, and those memory cells having target data states within L12-L15, while respective particular data states for those pluralities of memory cells might correspond to the data states L1, L4, L8 and L12, respectively. Other variations might be used, provided that at least one plurality of memory cells contains memory cells having a corresponding particular data state of a plurality of data states of a programming operation, and at least one other data state (e.g., higher data state) of the plurality of data states. For example, non-binary numbers of pluralities of memory cells might be used, e.g., using the data states L1, L6 and L11 as the respective particular data states for three pluralities of QLC memory cells.

Figure 5C:
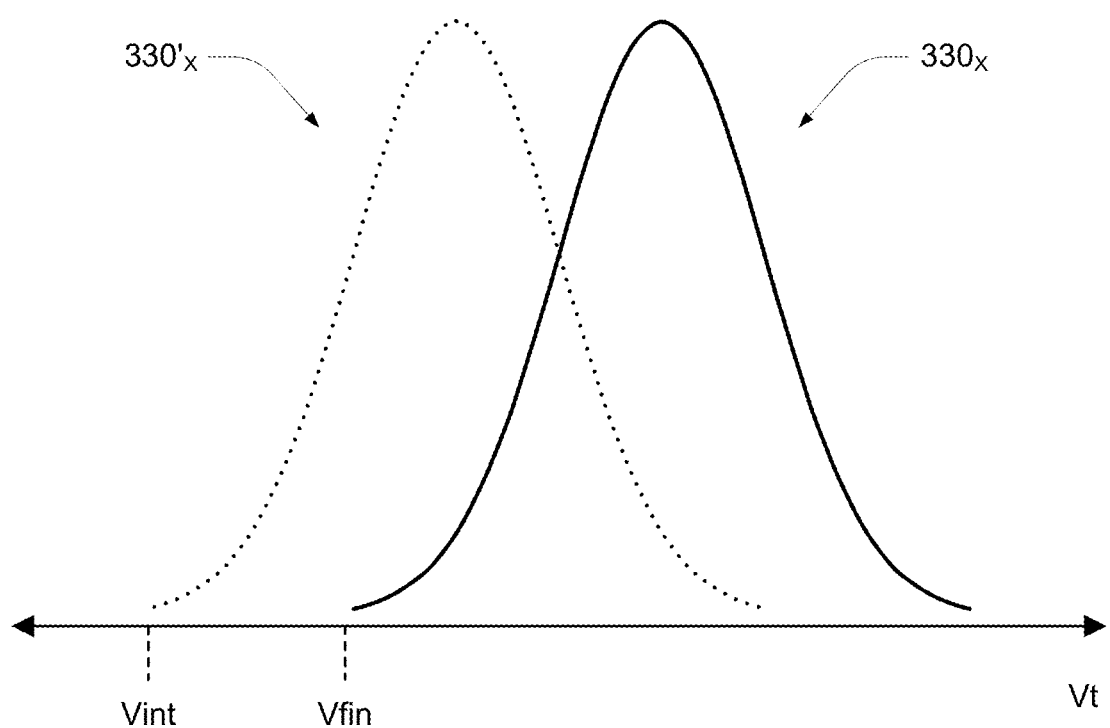

FIG. 5C conceptually depicts programming memory cells in accordance with the method of FIG. 4 and illustrating programming memory cells to an interim threshold voltage range before programming those memory cells to a final threshold voltage range. FIG. 5C depicts a threshold voltage range $330_X$. The threshold voltage range $330_X$ might correspond to any one of the threshold voltage ranges $330_1$-$330_7$, e.g., X might be any integer value from 1 to 7 in the example of FIG. 3. FIG. 5C further depicts an interim threshold voltage range $330'_X$, which might correspond to some range of threshold voltages lower than the threshold voltage range $330_X$. Programming memory cells to the interim threshold voltage range $330'_X$ might use an interim verify voltage level Vint (which might also be an interim target threshold voltage) associated with the threshold voltage range $330_X$. The interim verify voltage level Vint might be selected to mitigate a risk of programming memory cells above their final threshold voltage range $330_X$ and to facilitate a more compact threshold voltage range $330_X$. An absolute value of a voltage difference between the interim verify voltage level Vint and the final verify voltage level Vfin for the threshold voltage range $330_X$ for a particular value of X might be different than (e.g., greater than) the absolute value of the voltage difference for a lower value of X, which might include each lower value of X, and might be different than (e.g., less than) the absolute value of the voltage difference for a higher value of X, which might include each higher value of X. While FIG. 5C depicts one interim verify voltage level, additional interim verify voltage levels might facilitate further tightening of the width of the final threshold voltage range $330_X$.

Figure 6A:
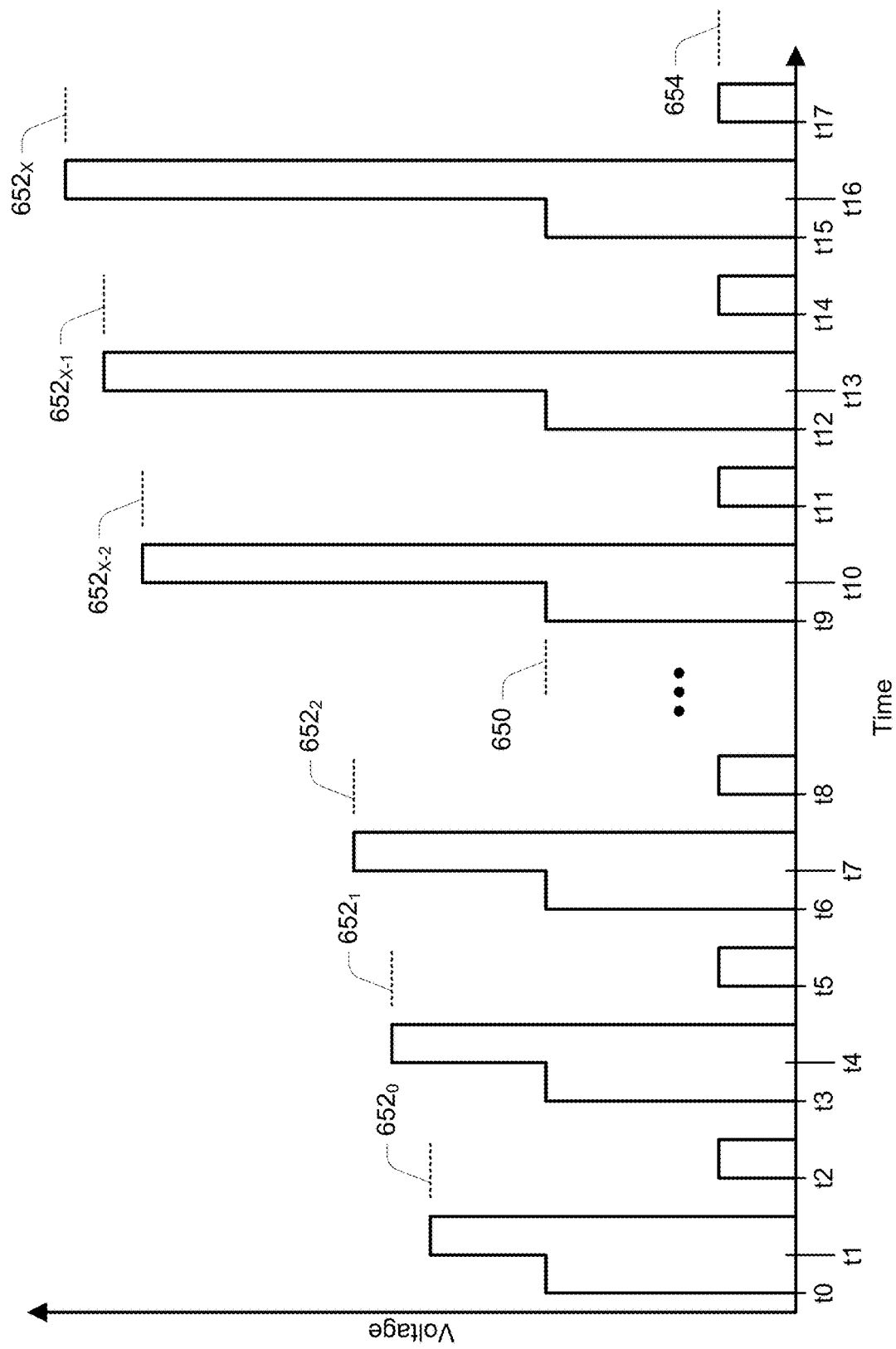
FIGS. 6A and 6B depict voltage levels as might be applied to a selected access line for a programming operation in accordance with embodiments.

FIG. 6A depicts voltage levels as might be applied to a selected access line for a programming operation, e.g., for programming a plurality of memory cells, in accordance with an embodiment. For example, FIG. 6A might correspond to the programming of a plurality of memory cells to a particular data state as represented by line $540_{0-1}$ of FIG. 5A. Consider the portion of the array of memory cells 200A of FIG. 2A, where the plurality of memory cells (e.g., memory cells selected for programming) are connected to the access line $202_{x+1}$, and memory cells (e.g., all memory cells) connected to access lines $202_0$-$202_x$ and $202_{x+2}$-$202_N$ are not selected for programming, and are thus to be inhibited from programming, e.g., for each programming pulse. In this example, the access line $202_{x+1}$ would be a selected access line, e.g., an access line selected for programming, while access lines $202_0$-$202_x$ and $202_{x+2}$-$202_N$ would be unselected access lines, e.g., access lines unselected for programming. Similarly, in this example, data lines 204 selectively connected to memory cells selected for programming would be selected, or enabled, data lines, while data lines 204 selectively connected to no memory cell selected for programming would be unselected, or inhibited, data lines.

At time t0, the voltage level applied to the selected access line might be raised to some voltage level 650. The voltage level 650 might be a voltage level to be applied to the unselected access lines during programming of the selected memory cells, and might generally be sufficient to activate the corresponding memory cells regardless of their data states, e.g., a pass voltage Vpass. Although such action is not necessary, power savings might be attained by raising the voltage level of the selected access line to the pass voltage along with voltage levels of unselected access lines.

At time t1, the voltage level applied to the selected access line might be raised (e.g., further raised) to some voltage level $652_0$. While the voltage level of the selected access line is at the voltage level $652_0$, memory cells selected for programming might be enabled for programming, e.g., by applying an enable voltage to their respective data lines. Other memory cells connected to the selected access line might be inhibited from programming, e.g., by applying an inhibit voltage to their respective data lines. The voltage level $652_0$, e.g., a programming voltage level if the channel is deemed to be 0V, might be sufficient to change (e.g., increase) threshold voltages of selected memory cells enabled for programming. The voltage level of the selected access line might be subsequently returned to an initial voltage level, e.g., a reference potential, such as $V_{SS}$, ground or 0V. The application of a voltage level expected and intended to change threshold voltages of selected and enabled memory cells (e.g., at least one selected and enabled memory cell) might be referred to as a programming pulse. The application of the interim voltage level 650 is not part of the programming pulse as it also applied to unselected memory cells having the same channel voltage (e.g., other memory cells of any string of series-connected memory cells containing a memory cell selected for programming), and thus is not expected and intended to change the threshold voltage of any memory cell in any appreciable manner.

At time t2, the voltage level applied to the selected access line might be raised to a verify voltage level 654. The verify voltage level 654 might correspond to the particular data state to which memory cells selected for programming are to be programmed. As an example, if the particular data state is the data state L1 of FIG. 3, the verify voltage level 654 might correspond to the verify voltage level V1. The application of the verify voltage level 654 might be referred to as a verify pulse. Selected memory cells that are deactivated in response to the verify voltage level 654 might be deemed to have passed the verify operation, e.g., deemed to have reached the particular data state. Such memory cells might be inhibited from further programming during any subsequent programming pulses. Selected memory cells that are activated in response to the verify voltage level 654 might be deemed to have failed the verify operation, e.g., deemed to have not yet reached the particular data state. Such memory cells might remain selected memory cells for one or more subsequent programming pulses. The voltage level of the selected access line might be subsequently returned to its initial voltage level.

If any memory cells selected for programming at time t0 remain selected for programming, the voltage level applied to the selected access line might be raised to the voltage level 650 at time t3. At time t4, the voltage level applied to the selected access line might be raised (e.g., further raised) to some voltage level $652_1$. The voltage level $652_1$, e.g., a programming voltage level if the channel is deemed to be 0V, might be sufficient to change (e.g., increase) threshold voltages of selected memory cells enabled for programming. The voltage level $652_1$ might be higher than the voltage level $652_0$. An absolute value of the voltage difference between the voltage level $652_1$ and the voltage level $652_0$ might generally be less than the absolute value of the voltage difference between any two adjacent verify voltage levels, e.g., V1 and V2, V2 and V3, V3 and V4, etc. The voltage level of the selected access line might be subsequently returned to its initial voltage level. At time t5, the voltage level applied to the selected access line might be raised to the verify voltage level 654. The voltage level of the selected access line might be subsequently returned to its initial voltage level.

This process of applying programming pulses followed by verify pulses might be repeated for successively higher programming voltage levels $652_2$-$652_X$ until memory cells selected for programming at time t0 (e.g., all memory cells selected for programming at time t0) have reached the particular data state, or until the programming operation is deemed to have failed. For example, the programming operation might define some threshold, e.g., a maximum acceptable number of programming pulses or a maximum acceptable magnitude for a programming voltage level, and the programming operation might be deemed to have failed if any memory cells selected for programming at time t0 remain selected for programming after reaching or exceeding the threshold.

Figure 6B:
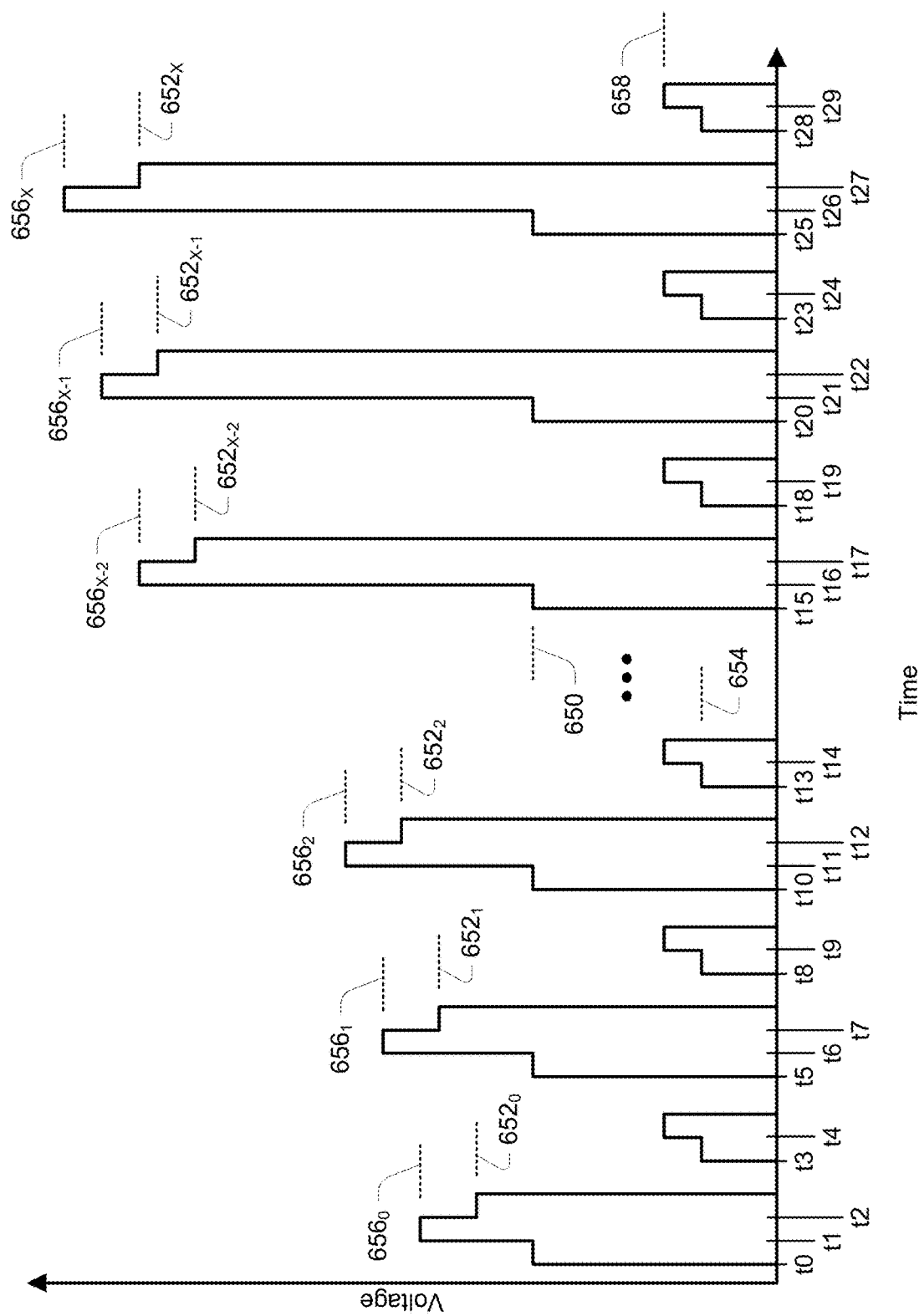

FIG. 6B depicts voltage levels as might be applied to a selected access line for a programming operation, e.g., for programming multiple pluralities of memory cells, in accordance with another embodiment. FIG. 6B might correspond to the programming (e.g., concurrent programming) of a first plurality of memory cells to a first particular data state as represented by line $540_{0-4}$ of FIG. 5B and of a second plurality of memory cells to a second particular data state as represented by line $540_{0-1}$ of FIG. 5B, for example.

Similar to the discussion of FIG. 6A, the voltage level applied to the selected access line might be raised to the voltage level 650 at time t0. At time t1, the voltage level applied to the selected access line might be raised (e.g., further raised) to some voltage level $656_0$. While the voltage level of the selected access line is at the voltage level $656_0$, memory cells selected for programming to the first particular data state (e.g., memory cells of the first plurality of memory cells) might be enabled for programming. Other memory cells connected to the selected access line might be inhibited from programming. The voltage level $656_0$, e.g., a programming voltage level if the channel is deemed to be 0V, might be sufficient to change (e.g., increase) threshold voltages of selected memory cells enabled for programming. At time t2, the voltage level applied to the selected access line might be lowered to some voltage level $652_0$. While the voltage level of the selected access line is at the voltage level $652_0$, memory cells selected for programming to the second particular data state (e.g., memory cells of the second plurality of memory cells) might be enabled for programming. Other memory cells connected to the selected access line might be inhibited from programming. The voltage level $652_0$, e.g., a programming voltage level if the channel is deemed to be 0V, might be sufficient to change (e.g., increase) threshold voltages of selected memory cells enabled for programming. The voltage level of the selected access line might be subsequently returned to an initial voltage level, e.g., a reference potential, such as Vss, ground or 0V. The application of a voltage level expected and intended to change threshold voltages of selected and enabled memory cells (e.g., at least one selected and enabled memory cell) might be referred to as a programming pulse. Accordingly, the application of both the voltage level $656_0$ and the voltage level $652_0$ might be referred to as a programming pulse, e.g., a multi-level programming pulse. Although FIG. 6B depicts the application of the voltage level $656_0$ before the voltage level $652_0$, their order could be altered. The application of the interim voltage level 650 is not part of the multi-level programming pulse as it also applied to unselected memory cells having the same channel voltage (e.g., other memory cells of any string of series-connected memory cells containing a memory cell selected for programming), and thus is not expected and intended to change the threshold voltage of any memory cell in any appreciable manner.

At time t3, the voltage level applied to the selected access line might be raised to a verify voltage level 654. The verify voltage level 654 might correspond to the second particular data state to which memory cells selected for programming are to be programmed. As an example, if the second particular data state is the data state L1 of FIG. 3, the verify voltage level 654 might correspond to the verify voltage level V1. Selected memory cells whose target data state is the second particular data state and that are deactivated in response to the verify voltage level 654 might be deemed to have passed the verify operation for the second particular data state, e.g., deemed to have reached the second particular data state. Such memory cells might be inhibited from further programming during subsequent programming pulses. Selected memory cells whose target data state is the second particular data state and that are activated in response to the verify voltage level 654 might be deemed to have failed the verify operation, e.g., deemed to have not yet reached the second particular data state. Such memory cells might remain selected memory cells for one or more subsequent programming pulses.

At time t4, the voltage level applied to the selected access line might be raised (e.g., further raised) to a verify voltage level 658. The verify voltage level 658 might correspond to the first particular data state to which memory cells selected for programming are to be programmed. As an example, if the first particular data state is the data state L4 of FIG. 3, the verify voltage level 658 might correspond to the verify voltage level V4. Selected memory cells whose target data state is the first particular data state and that are deactivated in response to the verify voltage level 658 might be deemed to have passed the verify operation for the first particular data state, e.g., deemed to have reached the first particular data state. Such memory cells might be inhibited from further programming during subsequent programming pulses. Selected memory cells whose target data state is the first particular data state and that are activated in response to the verify voltage level 658 might be deemed to have failed the verify operation, e.g., deemed to have not yet reached the first particular data state. Such memory cells might remain selected memory cells for one or more subsequent programming pulses. The application of the verify voltage levels 654 and 658 might be referred to as a verify pulse, e.g., a multi-level verify pulse. The voltage level of the selected access line might be subsequently returned to its initial voltage level. Although FIG. 6B depicts the application of the verify voltage level 658 before the verify voltage level 654, their order could be altered.

If any memory cells selected for programming at time t0 remain selected for programming, the voltage level applied to the selected access line might be raised to the voltage level 650 at time t5. At time t6, the voltage level applied to the selected access line might be raised (e.g., further raised) to some voltage level $656_1$. While the voltage level of the selected access line is at the voltage level $656_1$, memory cells selected for programming to the first particular data state might be enabled for programming. Other memory cells connected to the selected access line might be inhibited from programming. The voltage level $656_1$, e.g., a programming voltage level if the channel is deemed to be 0V, might be sufficient to change (e.g., increase) threshold voltages of selected memory cells enabled for programming. At time t7, the voltage level applied to the selected access line might be lowered to some voltage level $652_1$. While the voltage level of the selected access line is at the voltage level $652_1$, memory cells selected for programming to the second particular data state might be enabled for programming. Other memory cells connected to the selected access line might be inhibited from programming. The voltage level $652_1$, e.g., a programming voltage level if the channel is deemed to be 0V, might be sufficient to change (e.g., increase) threshold voltages of selected memory cells enabled for programming. The voltage level $656_1$ might be higher than the voltage level $656_0$, and the voltage level $652_1$ might be higher than the voltage level $652_0$. An absolute value of the voltage difference between the voltage level $656_1$ and the voltage level $656_0$, and an absolute value of the voltage difference between the voltage level $652_1$ and the voltage level $652_0$, might generally be less than the absolute value of the voltage difference between any two adjacent verify voltage levels, e.g., V1 and V2, V2 and V3, V3 and V4, etc. The voltage level of the selected access line might be subsequently returned to its initial voltage level. At time t8, the voltage level applied to the selected access line might be raised to the verify voltage level 654. At time t9, the voltage level applied to the selected access line might be raised (e.g., further raised) to the verify voltage level 658. The voltage level of the selected access line might be subsequently returned to its initial voltage level.

This process of applying programming pulses followed by verify pulses might be repeated for successively higher programming voltage levels $656_2$-$656_X$, and successively higher programming voltage levels $652_2$-$652_X$, until memory cells selected for programming at time t0 have reached their respective particular data states, or until the programming operation is deemed to have failed. While FIG. 6B utilized multi-level programming pulses, single level programming pulses might instead be used with the multi-level verify pulses to achieve a similar end result.

Furthermore, FIG. 6B utilized two different verify voltage levels for programming two mutually-exclusive pluralities of memory cells to their respective target data states. If a programming operation is to further concurrently program one or more additional mutually-exclusive pluralities of memory cells to additional respective particular data states, it will be apparent that additional respective verify voltage levels might be used for each such additional plurality of memory cells. Although not necessary, each multi-level programming pulse might also further utilize additional respective voltage levels for each such additional plurality of memory cells.

Figure 7A:
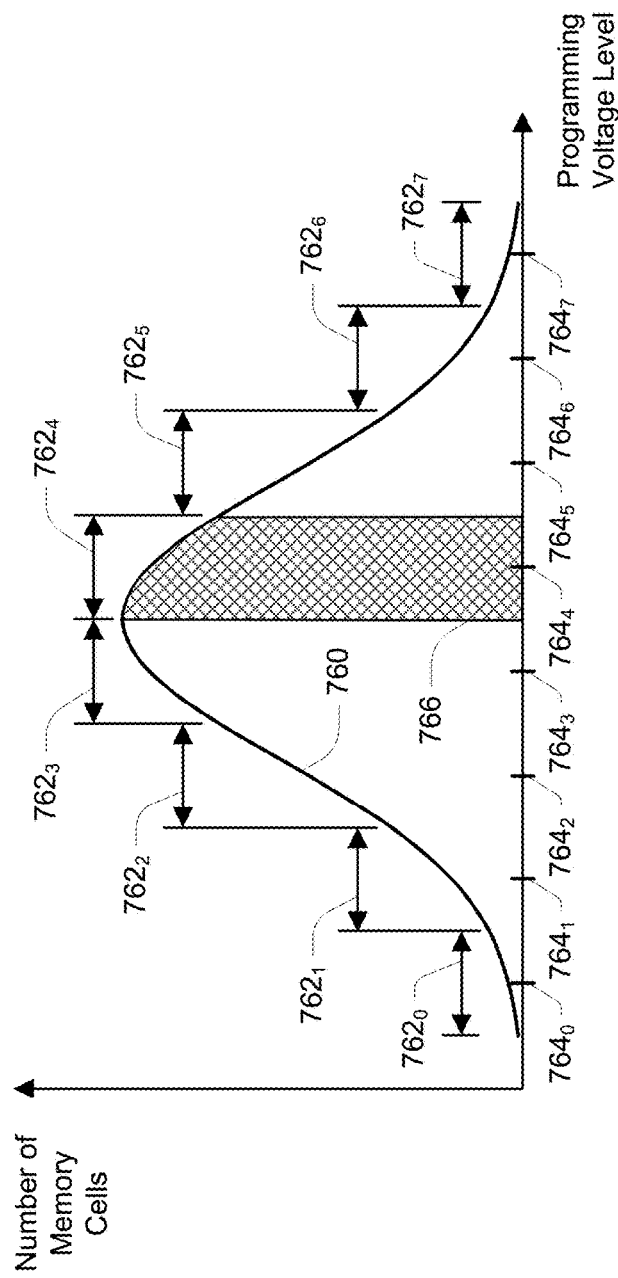
FIG. 7A depicts an idealized representation of a distribution of memory cells reaching a particular data state as a function of programming voltage level in accordance with embodiments.

When programming a plurality of memory cells to a particular data state, e.g., as described with reference to FIGS. 6A and 6B, it might be expected that memory cells of that plurality of memory cells will reach the particular data state in response to different programming voltage levels. For example, fast programming memory cells might reach the particular data state following a programming pulse having a lower programming voltage level than slow programming memory cells. As a result, a distribution, which might approximate a Gaussian distribution, might result corresponding to a number of memory cells reaching the particular data state at each of a plurality of different programming voltage levels. FIG. 7A depicts an idealized representation of a distribution of memory cells 760 reaching a particular data state as a function of programming voltage level in accordance with embodiments. As programming voltage levels are generally discrete values, such distributions might take the form of a histogram in practice. However, the concepts described herein equally apply.

In FIG. 7A, the distribution of memory cells 760, e.g., the plurality of memory cells, might be divided into a plurality of subsets (e.g., mutually-exclusive subsets) of memory cells, each corresponding to a respective range of programming voltage levels 762. In the example of FIG. 7A, there are eight subsets of memory cells corresponding to eight respective ranges of programming voltage levels $762_0$-$762_7$. Each range of programming voltage levels 762 might correspond to a respective representative programming voltage level 764. Continuing with the example of FIG. 7A, the eight ranges of programming voltage levels $762_0$-$762_7$ might correspond to eight representative programming voltage levels $764_0$-$764_7$, respectively. The representative programming voltage level 764 for a particular subset of memory cells, e.g., corresponding to its respective range of programming voltage levels 762, might correspond to a voltage level deemed to cause the memory cells (e.g., each memory cell) of that subset of memory cells to reach the particular data state.

Each representative programming voltage level 764 might be a lower (e.g., lowest) value of its corresponding range of programming voltage levels 762, an upper (e.g., highest) value of its corresponding range of programming voltage levels 762, an average of its corresponding range of programming voltage levels 762, or some other value from the lower value to the upper value of its corresponding range of programming voltage levels 762. As used herein, an average will refer to any measure of central tendency of a data set, e.g., a mean, a median and/or a mode of that data set.

Where the subset of memory cells corresponding to a particular range of programming voltage levels 762 represents the number of memory cells reaching the particular data state in response to a single programming voltage level, the representative programming voltage level might be that single programming voltage level. For example, assume the subset of memory cells 766, corresponding to the range of programming voltage levels $762_4$, represents those memory cells reaching the particular data state in response to the programming voltage level $656_2$ of FIG. 6B. In this example, the representative voltage level $764_4$ might be deemed to equal the voltage level $656_2$. Similarly, consider the example where the subset of memory cells corresponding to a particular range of programming voltage levels 762 represents the number of memory cells reaching the particular data state in response to any one of a number of programming voltage levels. For this example, assume the subset of memory cells 766 represents those memory cells reaching the particular data state in response to the programming voltage level $652_{X-2}$, the programming voltage level $652_{X-1}$, or the programming voltage level $652_X$ of FIG. 6B. For this example, the representative voltage level $764_4$ might, for some embodiments, be deemed to equal an average of the voltage levels $656_{X-2}$, $656_{X-1}$, and $656_X$.

Referring to the examples of FIGS. 5A and 5B, the distribution of memory cells 760 reaching the particular data state might correspond to memory cells reaching the data state L1 or the data state L4, for example. The particular data state corresponds to a respective range of threshold voltages. For example, if the particular data state corresponds to the data state L1, it might further correspond to the threshold voltage range $330_1$ in FIG. 3. The particular data state might have a representative threshold voltage. For example, a representative threshold voltage of the data state L1 and the threshold voltage range $330_1$ might be a lower (e.g., lowest) value of the threshold voltage range $330_1$, an upper (e.g., highest) value of the threshold voltage range $330_1$, an average of the threshold voltage range $330_1$, or some other value from the lower value to the upper value of the threshold voltage range $330_1$. For some embodiments, the representative threshold voltage of the particular data state might be equal to the verify voltage level used to determine whether memory cells have reached the particular data state.

The distribution of memory cells 760 reaching the particular data state might represent memory cells each having one of a plurality of different target data states for the programming operation. Similarly, each subset of memory cells corresponding to the ranges of programming voltage levels $762_0$-$762_7$ might contain memory cells each having one of the plurality of different target data states. For example, where the particular data state is the data state L1 of FIG. 3, the subset of memory cells 766 might include a memory cell whose target data state is the data state L1, a memory cell whose target data state is the data state L2, a memory cell whose target data state is the data state L3, a memory cell whose target data state is the data state L4, a memory cell whose target data state is the data state L5, a memory cell whose target data state is the data state L6, and/or a memory cell whose target data state is the data state L7.

Figure 7B:
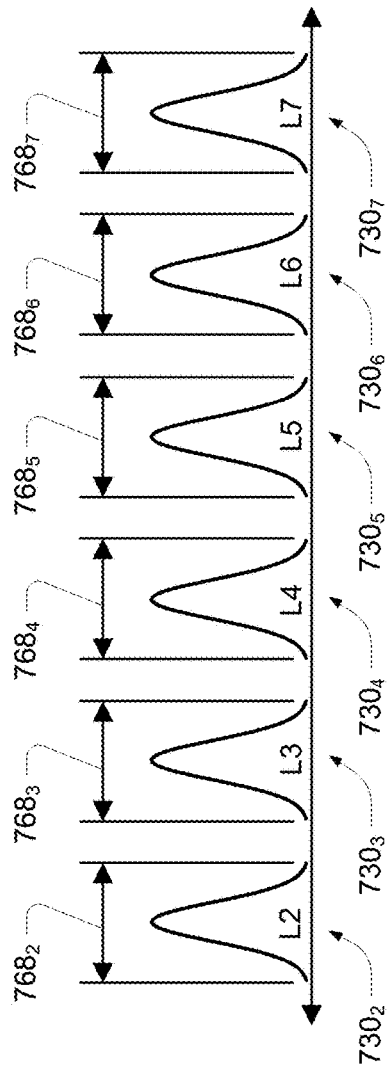
FIG. 7B depicts an idealized representation of threshold voltage ranges of memory cells programmed to respective target data states from a particular data state in accordance with embodiments.

The memory cells of each subset of memory cells of the distribution of memory cells 760 not already at their target data state (e.g., memory cells other than those memory cells whose target data state is the particular data state) might be subsequently programmed to their respective target data states. FIG. 7B depicts an idealized representation of threshold voltage ranges of memory cells programmed to respective target data states from a particular data state in accordance with embodiments. Consider the example that the particular data state corresponds to the data state L1 of FIG. 3, and the subset of memory cells 760 includes memory cells whose target data states represent each data state from L1 to L7. Subsequent programming of the memory cells of the subset of memory cells 760 to their respective target data states L2-L7 might result in a plurality of distributions of memory cells $730_2$-$730_7$, respectively. Each distribution of memory cells $730_2$-$730_7$ might have a corresponding width (e.g., range of threshold voltages) $768_2$-$768_7$, respectively. Ideally, in this example, each width $768_2$-$768_7$ might equal the width of the range of programming voltage levels $762_4$. However, it is expected that the widths 768 might increase for successively higher data states, e.g., that the width $768_2$ might be less than the width $768_3$, the width $768_3$ might be less than the width $768_4$, the width $768_4$ might be less than the width $768_5$, and so on.

To program the memory cells of each subset of memory cells of the distribution of memory cells 760 not already at their target data state, an indication of a programming voltage level deemed sufficient to program a memory cell to a respective threshold voltage corresponding to its respective target data state might be determined for each such memory cell. For memory cells of a particular subset of memory cells, this indication might be determined in response to the representative programming voltage level of that subset of memory cells and the representative threshold voltage of the particular data state, as well as a representative threshold voltage level of the target threshold voltage range. For example, a representative VgVt might be determined for each subset of memory cells, and respective values of representative VgVt values might be corrected for the representative threshold voltage level of the respective target threshold voltage range (e.g., as previously described) for each memory cell being further programmed. The representative VgVt for a particular subset of memory cells might equal the representative programming voltage level of that subset of memory cells minus the representative threshold voltage of the particular data state.

FIG. 8 depicts a flowchart of a method of operating a memory according to an embodiment. The method might be in the form of computer-readable instructions, e.g., stored to the instruction registers 128. Such computer-readable instructions might be executed by a controller, e.g., the control logic 116, to cause the memory (e.g., relevant components of the memory) to perform the method.

At 811, a plurality of programming pulses might be applied to a selected access line connected to each memory cell of a plurality of memory cells during programming of the plurality of memory cells to a particular data state of a plurality of data states. Each programming pulse of the plurality of programming pulses might have a respective voltage level of a first plurality of voltage levels. In the example of FIG. 6A, the first plurality of voltage levels might correspond to the voltage levels $652_0$-$652_X$. In the example of FIG. 6B, the first plurality of voltage levels might correspond to the voltage levels $652_0$-$652_X$ or to the voltage levels $656_0$-$656_X$. For embodiments such as described with reference to FIG. 6B, the method of FIG. 8 might be performed concurrently for multiple, mutually exclusive, pluralities of memory cells.

Each memory cell of the plurality of memory cells might have a respective target data state of the plurality of data states (e.g., of a programming operation) that is equal to or higher than the particular data state. For example, in an embodiment as described with reference to FIG. 5A or 6A, the particular data state might correspond to the data state L1, and the plurality of memory cells might correspond to those memory cells having target data states within L1-L7. For another example, in an embodiment as described with reference to FIG. 5B or 6B, the particular data state might correspond to the data state L1 or L4, and the plurality of memory cells might correspond to those memory cells having target data states within L1-L3 or within L4-L7, respectively. For embodiments such as described with reference to FIG. 5B or 6B, the method of FIG. 8 might be performed concurrently for multiple, mutually exclusive, pluralities of memory cells.

At 813, for each memory cell of the plurality of memory cells whose respective target data state is higher than the particular data state, a respective voltage level of the first plurality of voltage levels deemed to cause that memory cell to reach the particular data state might be determined. For example, with reference to FIG. 6B, assume that the particular data state corresponds to the verify voltage level 654 and the first plurality of voltage levels corresponds to the voltage levels $652_0$-$652_X$. If a memory cell first passed verify during application of the verify voltage level 654 at time t13, it might be determined that the voltage level $652_2$ is deemed to have caused that memory cell to reach the particular data state.

At 815, for each memory cell of the plurality of memory cells whose respective target data state is higher than the particular data state, a respective value indicative of a VgVt of that memory cell might be determined at a representative threshold voltage level for the particular data state. Continuing with example, the representative threshold voltage level for the particular data state might equal the verify voltage level 654 if the source of the memory cell is at 0V while verifying. The respective value indicative of a VgVt of a memory cell reaching the particular data state in response to applying the voltage level $652_2$ at time t12 might equal the voltage level $652_2$, minus the channel voltage level of that memory cell while applying the voltage level $652_2$, minus the representative threshold voltage level for the particular data state.

At 817, for each memory cell of the plurality of memory cells whose respective target data state is higher than the particular data state, a respective voltage level of a second plurality of voltage levels deemed sufficient to program that memory cell to a respective threshold voltage corresponding to its respective target data state might be determined. The second plurality of voltage levels might correspond to the programming voltage levels resulting from a programming pulse to be used for further programming those memory cells of the plurality of memory cells whose respective target data states are higher than the particular data state. These programming voltage levels might be predetermined, and might each equal voltage levels applied to the selected access line. To determine a respective voltage level of the second plurality of voltage levels deemed sufficient to program a memory cell to a respective threshold voltage corresponding to its respective target data state, its respective value indicative of the VgVt might be corrected to the respective threshold voltage corresponding to its respective target data state. This corrected VgVt might be used to determine a programming voltage level deemed sufficient to program that memory cell to the respective threshold voltage corresponding to its respective target data state, e.g., its corrected VgVt value plus the respective threshold voltage corresponding to its respective target data state. A voltage level of the second plurality of voltage levels that is equal to or higher than the determined programming voltage level might be deemed to be the respective voltage level of the second plurality of voltage levels deemed sufficient to program that memory cell to the respective threshold voltage corresponding to its respective target data state.

For some embodiments, the second plurality of voltage levels might be determined after determining programming voltage levels deemed sufficient to program memory cells to the respective threshold voltages corresponding to their respective target data states for each memory cell of the plurality of memory cells whose respective target data state is higher than the particular data state. The resulting range of programming voltage levels could be used to determine a range of voltage levels for the second plurality of voltage levels, and intermediate values within this range of voltage levels could be selected based on the voltage generation capabilities of the memory, the desired widths of the threshold voltage ranges, the distribution characteristics of the determined range of programming voltage levels, etc.

At 819, a subsequent programming pulse might be applied to the selected access line and, for each memory cell of the plurality of memory cells whose respective target data state is higher than the particular data state, that memory cell might be enabled for programming when a voltage level of the subsequent programming pulse corresponds to the respective voltage level of the second plurality of voltage levels for that memory cell. The subsequent programming pulse might be a multi-level (e.g., stepped) programming pulse, with each level (or step) corresponding to a respective voltage level of the second plurality of voltage levels.

FIG. 9 conceptually depicts waveforms of voltage levels for various nodes for applying a multi-level programming pulse in accordance with an embodiment. The embodiment of FIG. 9 will be described assuming embodiments such as described with reference to FIGS. 5A and 5B, where memory cells being further programmed are those memory cells having target data states within the data states L2-L7.

FIG. 9 depicts a multi-level programming pulse having eight voltage levels, e.g., voltage levels $970_0$-$970_7$, which might correspond to the second plurality of voltage levels of FIG. 8. Additional, or fewer, voltage levels might be used. The trace Sel WL corresponds to the voltage level of the selected access line (e.g., selected word line). The traces BL0-BL7 each correspond to the voltage levels of subsets of data lines (e.g., bit lines) selectively connected to memory cells to be further programmed, and whose respective voltage level of the second plurality of voltage levels are the voltage levels $970_0$-$970_7$, respectively. The trace BLunsel corresponds to data lines (e.g., bit lines) selectively connected to memory cells for which no change (e.g., no further change) in data state is desired during the programming operation, or memory cells that are otherwise unselected for programming, e.g., memory cells connected to the selected access line that are not addressed by the programming operation.

In this example, each subset of data lines of the traces BL0-BL7 might include a data line selectively connected to a memory cell whose target data state is the data state L2, a data line selectively connected to a memory cell whose target data state is the data state L3, a data line selectively connected to a memory cell whose target data state is the data state L4 (e.g., for embodiments such as described with reference to FIG. 5A), a data line selectively connected to a memory cell whose target data state is the data state L5, a data line selectively connected to a memory cell whose target data state is the data state L6, and/or a data line selectively connected to a memory cell whose target data state is the data state L7. In other words, memory cells whose respective voltage level of the second plurality of voltage levels is the voltage level $970_Y$, where Y is an integer value from 0 to 7 in this example, might include a memory cell whose target data state is the data state L2, a memory cell whose target data state is the data state L3, a memory cell whose target data state is the data state L4 (e.g., for embodiments such as described with reference to FIG. 5A), a memory cell whose target data state is the data state L5, a memory cell whose target data state is the data state L6, and/or a memory cell whose target data state is the data state L7.

At time t0, BL0-BL7 and BLunsel might be raised to an inhibit voltage, e.g., Vcc, while Sel WL might be raised to an intermediate voltage level. As previously noted, the intermediate voltage level of Sel WL, e.g., the voltage level 650, is often utilized during programming operations to reduce the power needed to raise the voltage level of Sel WL to its intended voltage level of the programming pulse. It is noted that a variety of schemes are known for increasing a voltage level of a selected access line to its intended voltage level and for operating unselected access lines connected to a same string of series-connected memory cells as the selected access line. However, details of such schemes are not important to understanding the concepts disclosed herein.

At time t1, Sel WL might be raised (e.g., further raised) to a voltage level $970_0$ expected to program memory cells of the group of memory cells corresponding to BL0 to their respective target threshold voltages. The voltage level of BL0 might also be changed to the enable voltage, e.g., 0V, to enable programming of the corresponding group of memory cells. The voltage level of BL0 might subsequently be returned to the inhibit voltage, e.g., at or before time t2.

At time t2, Sel WL might be changed (e.g., lowered) to a voltage level $970_1$ expected to program memory cells of the group of memory cells corresponding to BL1 to their respective target threshold voltages. The voltage level of BL1 might also be changed to the enable voltage, e.g., 0V, to enable programming of the corresponding group of memory cells. The voltage level of BL1 might subsequently be returned to the inhibit voltage, e.g., at or before time t3.

At time t3, Sel WL might be changed (e.g., lowered) to a voltage level $970_2$ expected to program memory cells of the group of memory cells corresponding to BL2 to their respective target threshold voltages. The voltage level of BL2 might also be changed to the enable voltage, e.g., 0V, to enable programming of the corresponding group of memory cells. The voltage level of BL2 might subsequently be returned to the inhibit voltage, e.g., at or before time t4.

At time t4, Sel WL might be changed (e.g., lowered) to a voltage level $970_3$ expected to program memory cells of the group of memory cells corresponding to BL3 to their respective target threshold voltages. The voltage level of BL3 might also be changed to the enable voltage, e.g., 0V, to enable programming of the corresponding group of memory cells. The voltage level of BL3 might subsequently be returned to the inhibit voltage, e.g., at or before time t5.

At time t5, Sel WL might be changed (e.g., lowered) to a voltage level $970_4$ expected to program memory cells of the group of memory cells corresponding to BL4 to their respective target threshold voltages. The voltage level of BL4 might also be changed to the enable voltage, e.g., 0V, to enable programming of the corresponding group of memory cells. The voltage level of BL4 might subsequently be returned to the inhibit voltage, e.g., at or before time t6.

At time t6, Sel WL might be changed (e.g., lowered) to a voltage level $970_5$ expected to program memory cells of the group of memory cells corresponding to BL5 to their respective target threshold voltages. The voltage level of BL5 might also be changed to the enable voltage, e.g., 0V, to enable programming of the corresponding group of memory cells. The voltage level of BL5 might subsequently be returned to the inhibit voltage, e.g., at or before time t7.

At time t7, Sel WL might be changed (e.g., lowered) to a voltage level $970_6$ expected to program memory cells of the group of memory cells corresponding to BL6 to their respective target threshold voltages. The voltage level of BL6 might also be changed to the enable voltage, e.g., 0V, to enable programming of the corresponding group of memory cells. The voltage level of BL6 might subsequently be returned to the inhibit voltage, e.g., at or before time t8.

At time t8, Sel WL might be changed (e.g., lowered) to a voltage level $970_7$ expected to program memory cells of the group of memory cells corresponding to BL7 to their respective target threshold voltages. The voltage level of BL7 might also be changed to the enable voltage, e.g., 0V, to enable programming of the corresponding group of memory cells. The voltage level of BL7 might subsequently be returned to the inhibit voltage, e.g., at or before time t9. At time t9, Sel WL might be discharged, and at time t10, BL0-BL7 and BLunsel might be discharged.

A verify operation might be subsequently performed, with a number of verify voltage levels corresponding to the number of data states being verified. For example, where the data states L2-L7 are being verified, there might be six verify voltage levels, with each verify voltage level corresponding to a respective data state L2-L7. Memory cells failing verification for not reaching their respective target data states might be enabled for programming during a subsequent multi-level programming pulse. For example, each voltage level $970_0$-$970_7$ might be increased by some ΔV, and the method of FIG. 9 might be repeated with the failing memory cells again being enabled for programming at their corresponding voltage level 970. This process might be repeated until all memory cells pass verification, or a failure of the programming operation is declared. Additional programming in such a manner might further be desired where the memory cells pass a verify operation using interim verify voltage levels.

Alternatively, programming voltage levels deemed sufficient to program memory cells to the respective threshold voltage corresponding to their target data states might be re-determined, and the failing memory cells might be further programmed in response to these new programming voltage levels in the manner described above. For example, it could be determined at what verify voltage level the failing memory cells were deactivated, and the representative threshold voltages for those corresponding data states could be used to re-determine VgVt values responsive to their corresponding previously applied voltage 970. A memory cell activating in response to each of the verify voltage levels might use the representative threshold voltage of the particular data state in determining its revised VgVt value responsive to its corresponding previously-applied voltage level 970. The processes of re-determining programming voltage levels deemed sufficient to program memory cells to the respective threshold voltage corresponding to their target data states might also be used where the memory cells pass a verify operation using interim verify voltage levels, with the representative threshold voltages of the data states attained corresponding to the interim threshold voltage ranges (e.g., corresponding to the interim verify voltage levels), and the respective threshold voltages corresponding to their target data states now corresponding to final verify voltage levels.

Figure 10:
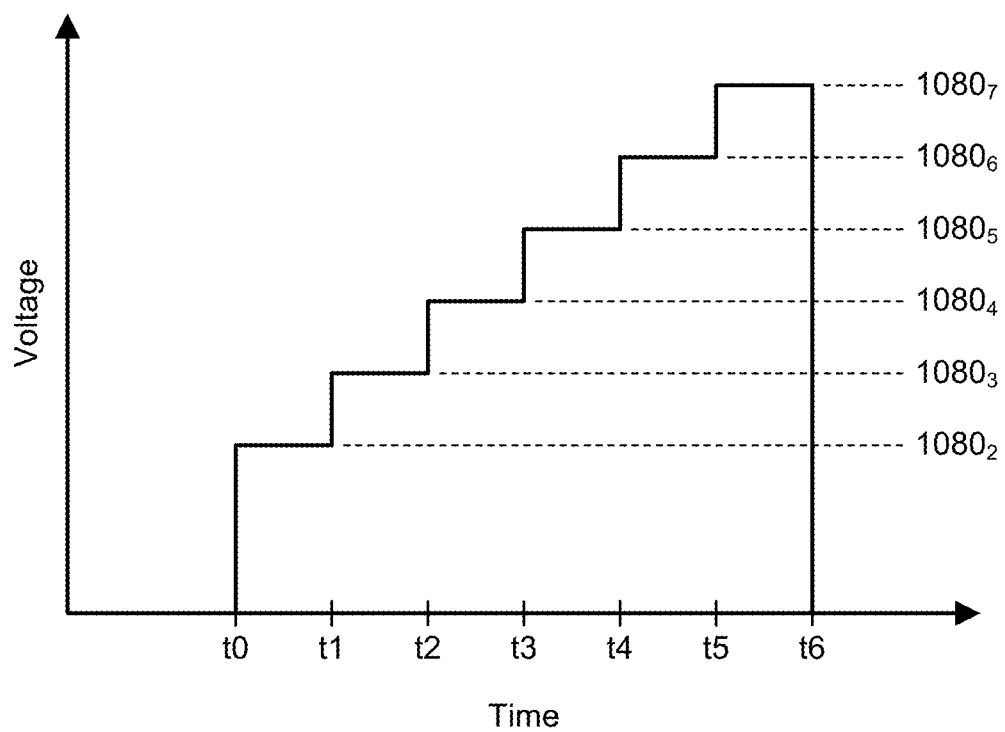
FIG. 10 depicts voltage levels applied to a selected access line to verify data states of memory cells programmed using a multi-level programming pulse in accordance with an embodiment.

FIG. 10 depicts voltage levels applied to a selected access line to verify data states of memory cells programmed using a multi-level programming pulse in accordance with an embodiment, e.g., programmed using a multi-level programming pulse such as described with reference to FIG. 9.

At time t0, the voltage level applied to the selected access line might be raised to a verify voltage level $1080_2$. The verify voltage level $1080_2$ might correspond to a lowest data state to be verified. In the example of FIG. 9, the lowest data state being further programmed is the data state L2 of FIG. 3, such that the verify voltage level $1080_2$ might correspond to the verify voltage level V2. Selected memory cells that are activated in response to the verify voltage level $1080_2$ might be deemed to remain at the particular data state, or data state L1 in this example. Such activated memory cells whose target data state is higher than the particular data state might be deemed to have failed the verify operation. Selected memory cells that are deactivated in response to the verify voltage level $1080_2$ might be deemed to have reached a data state equal to or higher than the data state L2. Selected memory cells deactivated in response to the verify voltage level $1080_2$, and whose target data state is the data state L2, might be deemed to have passed (e.g., or provisionally passed) the verify operation.

At time t1, the voltage level applied to the selected access line might be raised (e.g., further raised) to a verify voltage level $1080_3$. The verify voltage level $1080_3$ might correspond to the next higher data state, e.g., the data state L3 in this example, such that the verify voltage level $1080_3$ might correspond to the verify voltage level V3. Selected memory cells that are first deactivated in response to the verify voltage level $1080_3$ might be deemed to have reached a data state equal to or higher than the data state L3. Selected memory cells deactivated in response to the verify voltage level $1080_3$, and whose target data state is the data state L3, might be deemed to have passed (e.g., or provisionally passed) the verify operation. Selected memory cells deactivated in response to the verify voltage level $1080_3$, and whose target data state is lower than the data state L3, might be deemed to have a data state higher than their target data state, and thus might be deemed to have failed the verify operation. For example, a memory cell whose target data state is the data state L2 that was deactivated in response to both the verify voltage level $1080_2$ and the verify voltage level $1080_3$, might be deemed to have failed the verify operation, despite previously provisionally passing verification. Alternatively, such a failure condition might be ignored, e.g., where error correction capabilities might be expected to tolerate such errors.

At time t2, the voltage level applied to the selected access line might be raised (e.g., further raised) to a verify voltage level $1080_4$. The verify voltage level $1080_4$ might correspond to the next higher data state, e.g., the data state L4 in this example, such that the verify voltage level $1080_4$ might correspond to the verify voltage level V4. Selected memory cells that are first deactivated in response to the verify voltage level $1080_4$ might be deemed to have reached a data state equal to or higher than the data state L4. Selected memory cells deactivated in response to the verify voltage level $1080_4$, and whose target data state is the data state L4, might be deemed to have passed (e.g., or provisionally passed) the verify operation. Selected memory cells deactivated in response to the verify voltage level $1080_4$, and whose target data state is lower than the data state L4, might be deemed to have a data state higher than their target data state, and thus might be deemed to have failed the verify operation. For example, a memory cell whose target data state is the data state L3 that was deactivated in response to both the verify voltage level $1080_3$ and the verify voltage level $1080_4$, might be deemed to have failed the verify operation, despite previously provisionally passing verification. Alternatively, such a failure condition might be ignored, e.g., where error correction capabilities might be expected to tolerate such errors.

At time t3, the voltage level applied to the selected access line might be raised (e.g., further raised) to a verify voltage level $1080_5$. For embodiments such as described with reference to FIG. 5B, the verify voltage level $1080_4$ might be skipped, e.g., the voltage level applied to the selected access line might be raised directly from the verify voltage level $1080_3$ to the verify voltage level $1080_5$ at time t3. The verify voltage level $1080_5$ might correspond to the next higher data state, e.g., the data state L5 in this example, such that the verify voltage level $1080_5$ might correspond to the verify voltage level V5. Selected memory cells that are first deactivated in response to the verify voltage level $1080_5$ might be deemed to have reached a data state equal to or higher than the data state L5. Selected memory cells deactivated in response to the verify voltage level $1080_5$, and whose target data state is the data state L5, might be deemed to have passed (e.g., or provisionally passed) the verify operation. Selected memory cells deactivated in response to the verify voltage level $1080_5$, and whose target data state is lower than the data state L5, might be deemed to have a data state higher than their target data state, and thus might be deemed to have failed the verify operation. For example, a memory cell whose target data state is the data state L4 that was deactivated in response to both the verify voltage level $1080_4$ and the verify voltage level $1080_5$, might be deemed to have failed the verify operation, despite previously provisionally passing verification. Alternatively, such a failure condition might be ignored, e.g., where error correction capabilities might be expected to tolerate such errors.

At time t4, the voltage level applied to the selected access line might be raised (e.g., further raised) to a verify voltage level $1080_6$. The verify voltage level $1080_6$ might correspond to the next higher data state, e.g., the data state L6 in this example, such that the verify voltage level $1080_6$ might correspond to the verify voltage level V6. Selected memory cells that are first deactivated in response to the verify voltage level $1080_6$ might be deemed to have reached a data state equal to or higher than the data state L6. Selected memory cells deactivated in response to the verify voltage level $1080_6$, and whose target data state is the data state L6, might be deemed to have passed (e.g., or provisionally passed) the verify operation. Selected memory cells deactivated in response to the verify voltage level $1080_6$, and whose target data state is lower than the data state L6, might be deemed to have a data state higher than their target data state, and thus might be deemed to have failed the verify operation. For example, a memory cell whose target data state is the data state L5 that was deactivated in response to both the verify voltage level $1080_5$ and the verify voltage level $1080_6$, might be deemed to have failed the verify operation, despite previously provisionally passing verification. Alternatively, such a failure condition might be ignored, e.g., where error correction capabilities might be expected to tolerate such errors.

At time t5, the voltage level applied to the selected access line might be raised (e.g., further raised) to a verify voltage level $1080_7$. The verify voltage level $1080_7$ might correspond to the next higher data state, e.g., the data state L7 in this example, such that the verify voltage level $1080_7$ might correspond to the verify voltage level V7. Selected memory cells that are first deactivated in response to the verify voltage level $1080_7$ might be deemed to have reached the data state L7. Selected memory cells deactivated in response to the verify voltage level $1080_7$, and whose target data state is the data state L7, might be deemed to have passed the verify operation. Selected memory cells deactivated in response to the verify voltage level $1080_7$, and whose target data state is lower than the data state L7, might be deemed to have a data state higher than their target data state, and thus might be deemed to have failed the verify operation. For example, a memory cell whose target data state is the data state L6 that was deactivated in response to both the verify voltage level $1080_6$ and the verify voltage level $1080_7$, might be deemed to have failed the verify operation, despite previously provisionally passing verification. Alternatively, such a failure condition might be ignored, e.g., where error correction capabilities might be expected to tolerate such errors.

The application of the verify voltage levels $1080_2$-$1080_7$ might be referred to as a verify pulse, e.g., a multi-level verify pulse. The voltage level of the selected access line might be subsequently returned to its initial voltage level at time t6. Although FIG. 10 depicts the application of the verify voltage levels $1080_2$-$1080_7$ in increasing order, their order could be altered.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. An apparatus, comprising:
an array of memory cells;
an access line connected to a plurality of memory cells; and
a controller for access of the array of memory cells, wherein the controller is configured to cause the apparatus to:
program the plurality of memory cells to a particular data state of a plurality of data states; and
for each memory cell of the plurality of memory cells whose target data state is higher than the particular data state:
determine a respective indication of a programming voltage level deemed sufficient to program that memory cell to a respective target threshold voltage corresponding to its respective target data state; and
after determining the respective indication of the programming voltage level deemed sufficient to program that memory cell to the respective target threshold voltage corresponding to its respective target data state, further program that memory cell using a programming voltage level of a plurality of programming voltage levels corresponding to the respective indication of the programming voltage level deemed sufficient to program that memory cell to the respective target threshold voltage corresponding to its respective target data state.

2. The apparatus of claim 1, wherein the access line is further connected to memory cells other than the plurality of memory cells.

3. The apparatus of claim 1, wherein, for each memory cell of the plurality of memory cells whose target data state is higher than the particular data state, the controller is further configured to cause the apparatus to verify whether that memory cell reached its respective target data state in response to programming that memory cell using the programming voltage level of the plurality of programming voltage levels corresponding to the respective indication of the programming voltage level deemed sufficient to program that memory cell to the respective target threshold voltages corresponding to its respective target data state.

4. The apparatus of claim 3, wherein the controller is further configured to cause the apparatus to further program memory cells that are deemed to fail the verify.

5. The apparatus of claim 4, wherein a particular memory cell of the plurality of memory cells is deemed to fail the verify, wherein the programming voltage level of the plurality of programming voltage levels corresponding to the respective indication of the programming voltage level deemed sufficient to program the particular memory cell to the respective target threshold voltage corresponding to its respective target data state is an Nth programming voltage level of the plurality of programming voltage levels, and wherein the controller being configured to cause the apparatus to further program the particular memory cell comprises the controller being configured to cause the apparatus to:
increase the voltage level of the Nth programming voltage level of the plurality of programming voltage levels; and
further program the particular memory cell using the Nth programming voltage level having the increased voltage level.

6. The apparatus of claim 1, wherein, for each memory cell of the plurality of memory cells whose target data state is higher than the particular data state, the respective target threshold voltage corresponding to its respective target data state is an interim target threshold voltage corresponding to its respective target data state.

7. The apparatus of claim 1, wherein the plurality of memory cells is a first plurality of memory cells, wherein the particular data state is a first particular data state of the plurality of data states, wherein the access line is further connected to a second plurality of memory cells, and wherein the controller is further configured to cause the apparatus to:
program the second plurality of memory cells to a second particular data state of the plurality of data states; and
for each memory cell of the second plurality of memory cells whose target data state is higher than the second particular data state:
determine a respective indication of a programming voltage level deemed sufficient to program that memory cell to a respective target threshold voltage corresponding to its respective target data state; and
further program that memory cell using a programming voltage level of the plurality of programming voltage levels corresponding to the respective indication of the programming voltage level deemed sufficient to program that memory cell to the respective target threshold voltage corresponding to its respective target data state.

8. The apparatus of claim 7, wherein each target data state of the memory cells of the second plurality of memory cells is higher than each target data state of the memory cells of the first plurality of memory cells.

9. The apparatus of claim 7, wherein the controller is configured to cause the apparatus to program the first plurality of memory cells to the first particular data state during a programming operation, and to concurrently program the second plurality of memory cells to the second particular data state during the programming operation.

10. The apparatus of claim 9, wherein the controller is further configured to concurrently program one or more additional pluralities of memory cells connected to the access line during the programming operation.

11. The apparatus of claim 10, wherein each target data state of the memory cells of the one or more additional pluralities of memory cells is a higher data state of the plurality of data states than each target data state of the memory cells of the second plurality of memory cells, and wherein each target data state of the memory cells of the second plurality of memory cells is a higher data state of the plurality of data states than each target data state of the memory cells of the first plurality of memory cells.

12. An apparatus, comprising:
an array of memory cells comprising a first plurality of memory cells and a second plurality of memory cells;
an access line connected to the first plurality of memory cells and to the second plurality of memory cells; and
a controller for access of the array of memory cells, wherein the controller, during a programming operation, is configured to cause the apparatus to:
program the first plurality of memory cells to a first particular data state of a plurality of data states of the programming operation and program the second plurality of memory cells to a second particular data state of the plurality of data states, wherein the second particular data state is a higher data state of the plurality of data states than the first particular data state; and for each memory cell of the first plurality of memory cells whose target data state of the programming operation is higher than the first particular data state and for each memory cell of the second plurality of memory cells whose target data state of the programming operation is higher than the second particular data state:

determine a respective indication of a programming voltage level deemed sufficient to program that memory cell to a respective target threshold voltage corresponding to its respective target data state; and after determining the respective indication of the programming voltage level deemed sufficient to program that memory cell to the respective target threshold voltage corresponding to its respective target data state, further program that memory cell using a programming voltage level of a plurality of programming voltage levels corresponding to the respective indication of the programming voltage level deemed sufficient to program that memory cell to the respective target threshold voltage corresponding to its respective target data state.

13. The apparatus of claim 12, wherein each target data state of the first plurality of memory cells is equal to or higher than the first particular data state and lower than the second particular data state, and wherein each target data state of the second plurality of memory cells is equal to or higher than the second particular data state.

14. The apparatus of claim 13, wherein the controller, during the programming operation, is further configured to cause the apparatus to:

program a third plurality of memory cells to a third particular data state of the plurality of data states concurrently with programming the first plurality of memory cells to the first particular data state and programming the second plurality of memory cells to the second particular data state, wherein the third particular data state is a higher data state of the plurality of data states than the second particular data state; and for each memory cell of the third plurality of memory cells whose target data state of the programming operation is higher than the third particular data state:

determine a respective indication of a programming voltage level deemed sufficient to program that memory cell to a respective target threshold voltage corresponding to its respective target data state; and after determining the respective indication of the programming voltage level deemed sufficient to program that memory cell to the respective target threshold voltage corresponding to its respective tar data state, further program that memory cell using a programming voltage level of the plurality of programming voltage levels corresponding to the respective indication of the programming voltage level deemed sufficient to program that memory cell to the respective target threshold voltage corresponding to its respective target data state.

15. The apparatus of claim 14, wherein each target data state of the second plurality of memory cells is equal to or higher than the second particular data state and lower than the third particular data state, and wherein each target data state of the third plurality of memory cells is equal to or higher than the third particular data state.

16. The apparatus of claim 15, wherein a union of a lowest data state of the plurality of data states, each target data state of the first plurality of memory cells, each target data state of the second plurality of memory cells, and each target data state of the third plurality of memory cells is a proper subset of the plurality of data states.

17. An apparatus, comprising:

an array of memory cells comprising a first plurality of memory cells and a second plurality of memory cells;

an access line connected to the first plurality of memory cells and to the second plurality of memory cells; and a controller for access of the array of memory cells, wherein the controller, during a programming operation, is configured to cause the apparatus to:

program the first plurality of memory cells to a first particular data state of a plurality of data states of the programming operation and program the second plurality of memory cells to a second particular data state of the plurality of data states, wherein the second particular data state is a higher data state of the plurality of data states than the first particular data state; and for each memory cell of the first plurality of memory cells whose target data state of the programming operation is higher than the first particular data state and for each memory cell of the second plurality of memory cells whose target data state of the programming operation is higher than the second particular data state:

determine a respective indication of a programming voltage level deemed sufficient to program that it cell to a respective target threshold voltage corresponding to its respective target data state; and program that memory cell using a programming voltage level of a plurality of programming voltage levels corresponding to the respective indication of the programming voltage level deemed sufficient to program that memory cell to the respective target threshold voltage corresponding to its respective target data state;

wherein each target data state of the first plurality of memory cells is equal to or higher than the first particular data state and lower than the second particular data state, and wherein each target data state of the second plurality of memory cells is equal to or higher than the second particular data state; and wherein a union of a lowest data state of the plurality of data states, each target data state of the first plurality of memory cells, and each target data state of the second plurality of memory cells comprises each data state of the plurality of data states.

18. A method of operating a memory, comprising:

programming a plurality of memory cells to a particular data state of a plurality of data states; and for each memory cell of the plurality of memory cells whose target data state is higher than the particular data state:

determining a respective indication of a programming voltage level deemed sufficient to program that memory cell to a respective target threshold voltage corresponding to its respective target data state; and after determining the respective indication of the programming voltage level deemed sufficient to program that memory cell to the respective target threshold voltage corresponding to its respective target data state, further programming that memory cell using a programming voltage level of a plurality of programming voltage levels corresponding to the respective indication of the programming voltage level deemed sufficient to program that memory cell to the respective target threshold voltage corresponding to its respective target data state.

19. A method of operating a memory, comprising:
applying a plurality of programming pulses to a selected access line connected to each memory cell of a plurality of memory cells during programming of the plurality of memory cells to a particular data state of a plurality of data states, wherein each programming pulse of the plurality of programming pulses has a respective voltage level of a first plurality of voltage levels, and wherein each memory cell of the plurality of memory cells has a respective target data state of the plurality of data states that is equal to or higher than the particular data state;
for each memory cell of the plurality of memory cells whose respective target data state is higher than the particular data state:
determining a respective voltage level of the first plurality of voltage levels deemed to cause that memory cell to reach the particular data state;
using the determined respective voltage level of the first plurality of voltage levels deemed to cause that memory cell to reach the particular data state to determine a respective value indicative of a VgVt of that memory cell at a representative threshold voltage level for the particular data state; and
using the determined respective value indicative of the VgVt of that memory cell at the representative threshold voltage level for the particular data state to determine a respective voltage level of a second plurality of voltage levels deemed sufficient to program that memory cell to a respective threshold voltage corresponding to its respective target data state; and
applying a subsequent programming pulse to the selected access line and, for each memory cell of the plurality of memory cells whose respective target data state is higher than the particular data state, enabling that memory cell for programming when a voltage level of the subsequent programming pulse corresponds to the respective voltage level of the second plurality of voltage levels for that memory cell.

20. An apparatus, comprising:
an array of memory cells comprising a plurality of memory cells;
an access line connected to the plurality of memory cells; and
a controller for access of the array of memory cells, wherein the controller, during a programming operation, is configured to cause the apparatus to:
apply a plurality of programming pulses to the access line during programming of the plurality of memory cells to a particular data state of a plurality of data states, wherein each programming pulse of the plurality of programming pulses has a respective voltage level of a first plurality of voltage levels, and wherein each memory cell of the plurality of memory cells has a respective target data state of the plurality of data states that is equal to or higher than the particular data state;
for each memory cell of the plurality of memory cells whose respective target data state is higher than the particular data state:
determine a respective voltage level of the first plurality of voltage levels deemed to cause that memory cell to reach the particular data state;
use the determined respective voltage level of the first plurality of voltage levels deemed to cause that memory cell to reach the particular data state to determine a respective value indicative of a VgVt of that memory cell at a representative threshold voltage level for the particular data state; and
use the determined respective value indicative of the VgVt of that memory cell at the representative threshold voltage level for the particular data state to determine a respective voltage level of a second plurality of voltage levels deemed sufficient to program that memory cell to a respective threshold voltage corresponding to its respective target data state; and
apply a subsequent programming pulse to the access line and, for each memory cell of the plurality of memory cells whose respective target data state is higher than the particular data state, enabling that memory cell for programming when a voltage level of the subsequent programming pulse corresponds to the respective voltage level of the second plurality of voltage levels for that memory cell.

21. The apparatus of claim 20, wherein the controller being configured to cause the apparatus to apply the plurality of programming pulses to the access line comprises the controller being configured to cause the apparatus to apply a plurality of multi-level programming pulses to the access line.

22. The apparatus of claim 21, wherein the controller is further configured to apply a pass voltage level to the access line immediately prior to applying each multi-level programming pulse of the plurality of multi-level programming pulses.

23. The apparatus of claim 20, wherein the representative threshold voltage level for the particular data state is equal to a verify voltage level used to determine whether a memory cell of the plurality of memory cells has reached the particular data state.

24. The apparatus of claim 23, wherein the respective threshold voltage corresponding to the respective target data state for a memory cell of the plurality of memory cells is equal to a verify voltage level used to determine whether that memory cell has reached its respective target data state.

25. The apparatus of claim 20, wherein the controller being configured to cause the apparatus to apply the subsequent programming pulse to the access line comprises the controller being configured to cause the apparatus to apply a multi-level programming pulse to the access line.

26. The apparatus of claim 25, wherein each voltage level of the multi-level programming pulse corresponds to a respective voltage level of the second plurality of voltage levels.

27. The apparatus of claim 25, wherein the controller being configured to cause the apparatus to apply the multi-level programming pulse to the access line comprises the controller being configured to cause the apparatus to apply each voltage level of the second plurality of voltage levels in a decreasing order from a highest voltage level of the second plurality of voltage levels to a lowest voltage level of the second plurality of voltage levels.

\* \* \* \* \*

UNITED STATES PATENT AND TRADEMARK OFFICE
CERTIFICATE OF CORRECTION

| | | |
|---|---|---|
| PATENT NO. | : 11,094,379 B1 | Page 1 of 1 |
| APPLICATION NO. | : 16/835664 | |
| DATED | : August 17, 2021 | |
| INVENTOR(S) | : Yip | |

It is certified that error appears in the above-identified patent and that said Letters Patent is hereby corrected as shown below:

In the Claims

Column 31, Claim 14, Line 56, delete "respective tar data" and insert in place thereof -- respective target data --

Signed and Sealed this
Eleventh Day of April, 2023

*Katherine Kelly Vidal*

Katherine Kelly Vidal
*Director of the United States Patent and Trademark Office*